(12) United States Patent
Yang et al.

(10) Patent No.: US 11,119,610 B2
(45) Date of Patent: Sep. 14, 2021

(54) TOUCH MEMBER AND DISPLAY DEVICE INCLUDING THE SAME

(71) Applicant: SAMSUNG DISPLAY CO., LTD., Yongin-si (KR)

(72) Inventors: Sung Jin Yang, Cheonan-si (KR); Su Jin Kim, Seoul (KR); Tae Gon Kim, Cheonan-si (KR); Han Soo Kim, Asan-si (KR); Hyun Sik Park, Cheonan-si (KR); Chun Gi You, Asan-si (KR); Chung Yi, Seongnam-si (KR); Sung Ho Cho, Yongin-si (KR); Min Ho Chae, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 186 days.

(21) Appl. No.: 16/241,307

(22) Filed: Jan. 7, 2019

(65) Prior Publication Data
US 2020/0033967 A1 Jan. 30, 2020

(30) Foreign Application Priority Data
Jul. 25, 2018 (KR) .................. 10-2018-0086622

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 27/323* (2013.01);
(Continued)

(58) Field of Classification Search
CPC .................. G06F 3/044; G06F 3/0412; G06F 2203/04111; H01L 27/323; H01L 51/5253; H01L 27/3244
See application file for complete search history.

(56) References Cited

U.S. PATENT DOCUMENTS

2015/0060256 A1* 3/2015 Kim ...................... G06F 3/044
                                                            200/600
2015/0185903 A1   7/2015 Park
                        (Continued)

FOREIGN PATENT DOCUMENTS

EP      2530565 A2   12/2012
EP      2650765      10/2013
                     (Continued)

OTHER PUBLICATIONS

European Search Report dated Sep. 2, 2019 in corresponding European Patent Application No. 1916568833 (7 pages).
(Continued)

*Primary Examiner* — Kent W Chang
*Assistant Examiner* — Andrew Lee
(74) *Attorney, Agent, or Firm* — F. Chau & Associates, LLC

(57) ABSTRACT

A touch member includes a first touch electrode including a plurality of first sub-detection electrode patterns. The touch member includes a second touch electrode including a plurality of second sub-detection electrode. An electrode pattern connecting portion electrically connects adjacent second sub-detection electrode patterns. An island electrode pattern is disposed in the second touch electrode. A bridge pattern electrically connects a first sub-detection electrode of the first sub-detection electrode patterns to the island electrode pattern. The bridge pattern is formed of a first conductive layer. The first sub-detection electrode patterns, the electrode pattern connecting portion, the second sub-detec-
(Continued)

tion electrode patterns, and the island electrode pattern are formed of a second conductive layer. An insulating pattern is disposed between the bridge pattern and a part of the second conductive layer overlapping with the bridge pattern. The insulating pattern does not overlap a part of the bridge pattern.

30 Claims, 23 Drawing Sheets

(51) Int. Cl.
*H01L 27/32* (2006.01)
*H01L 51/52* (2006.01)

(52) U.S. Cl.
CPC . *G06F 2203/04111* (2013.01); *H01L 27/3244* (2013.01); *H01L 51/5253* (2013.01)

(56) References Cited

U.S. PATENT DOCUMENTS

| | | | |
|---|---|---|---|
| 2015/0220191 A1* | 8/2015 | Huh | G06F 3/044 |
| | | | 345/173 |
| 2017/0139525 A1* | 5/2017 | Jo | G06F 3/041 |
| 2018/0190737 A1* | 7/2018 | Yang | H01L 51/56 |
| 2018/0314372 A1* | 11/2018 | Lee | G06F 3/0448 |

FOREIGN PATENT DOCUMENTS

| | | |
|---|---|---|
| EP | 2530565 A3 | 1/2014 |
| KR | 10-1082293 | 11/2011 |

OTHER PUBLICATIONS

Office Action dated Aug. 25, 2020 in corresponding European Patent Application No. 19165688.3 (5 pages).

* cited by examiner

FIG. 1
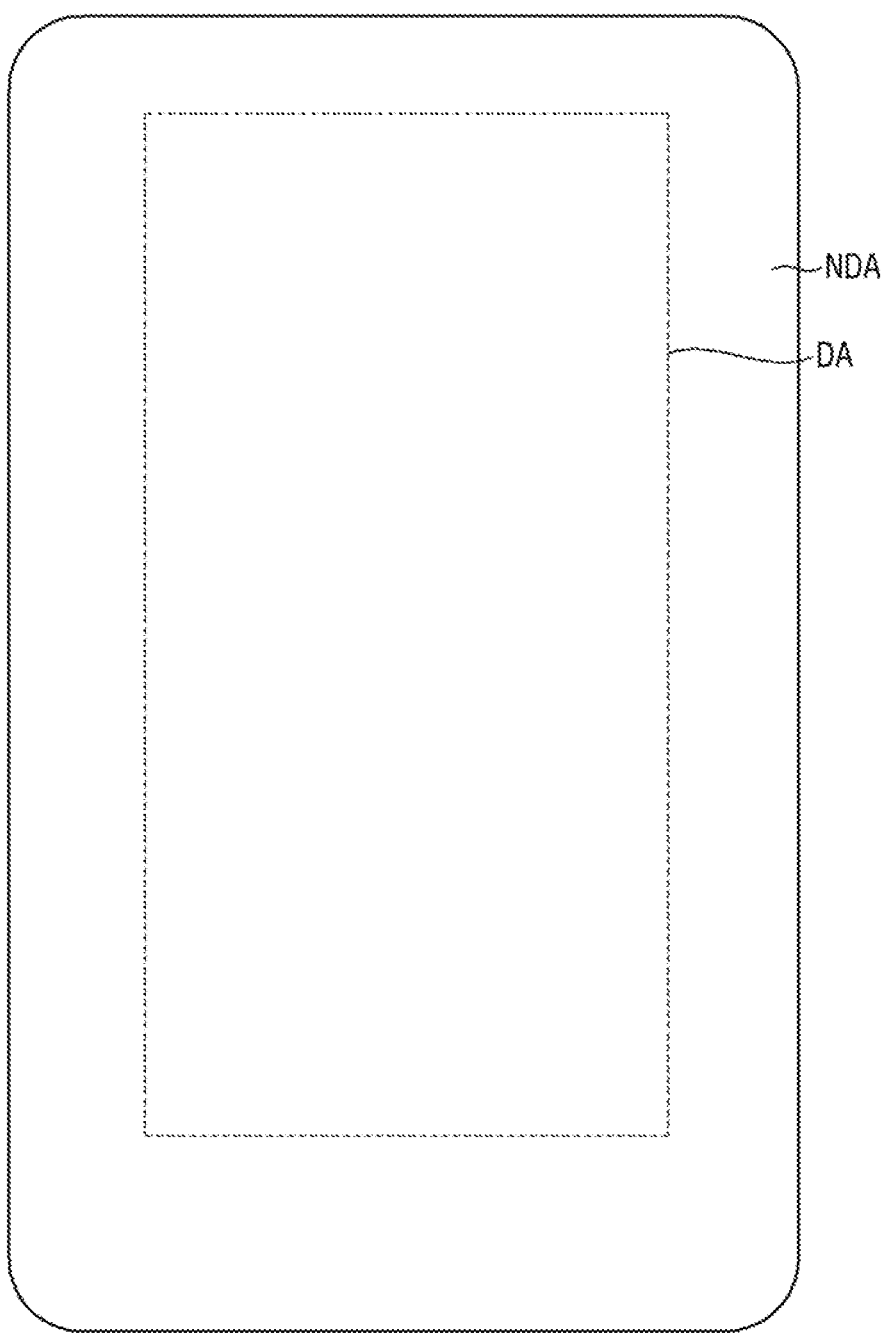
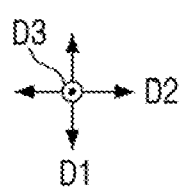

TOUCH MEMBER AND DISPLAY DEVICE INCLUDING THE SAME

CROSS-REFERENCE TO RELATED APPLICATION

This application claims priority under 35 U.S.C. § 119 to Korean Patent Application No. 10-2018-0086622, filed on Jul. 25, 2018, in the Korean Intellectual Property Office, the invention of which is incorporated by reference herein in its entirety.

1. TECHNICAL FIELD

Exemplary embodiments of the present invention relate to a touch member, and more particularly, to a display device including the same.

2. DISCUSSION OF RELATED ART

A touch member is a type of input device that can be installed in a display device, such as an organic light-emitting diode (OLED) display device, a liquid crystal display (LCD) device, a field emission display (FED) device, a plasma display panel (PDP) device, or an electroluminescent display device, and can allow a user to press or touch the display device with a part of his or her body to enter predetermined information while watching the display device. However, display panel warpage may occur as a result of using the display device.

The touch member may acquire coordinate information of a location where a touch event occurs and inputs information. A display member may be connected to the touch member and may display an image corresponding to the information input by the touch member.

There are various methods of implementing a touch event in a display device, such as a resistive film-type method, a light sensing-type method, or a capacitive-type method.

SUMMARY

An exemplary embodiment of the present invention provides a display device capable of preventing panel warpage.

According to an exemplary embodiment of the present invention, a touch member includes a first touch electrode including a plurality of first sub-detection electrode patterns arranged in a first direction. The touch member includes a second touch electrode including a plurality of second sub-detection electrodes arranged in a second direction, which intersects the first direction. An electrode pattern connecting portion electrically connects adjacent second sub-detection electrode patterns. An island electrode pattern is disposed in the second touch electrode and is isolated from the first touch electrode. A bridge pattern electrically connects a first sub-detection electrode of the first sub-detection electrode patterns to the island electrode pattern. The bridge pattern is formed of a first conductive layer. The first sub-detection electrode patterns, the electrode pattern connecting portion, the second sub-detection electrode patterns, and the island electrode pattern are formed of a second conductive layer. An insulating pattern is disposed between the bridge pattern and a part of the second conductive layer overlapping with the bridge pattern. The insulating pattern does not overlap a part of the bridge pattern.

According to an exemplary embodiment of the present invention, a display device includes a substrate and a driving circuit layer disposed on the substrate. The driving circuit layer includes a plurality of thin-film transistors. A light-emitting element layer is disposed on the driving circuit layer and includes a plurality of pixel electrodes. The plurality of pixel electrodes are connected to the thin-film transistors. An encapsulation film is disposed on the light-emitting element layer. A touch input sensing layer is disposed on the encapsulation film. A cover layer is disposed on the touch input sensing layer. The touch input sensing layer includes a first conductive layer, an insulating pattern disposed on the first conductive layer, and a second conductive layer disposed on the insulating pattern. The second conductive layer includes a first touch electrode including a plurality of first sub-detection electrode patterns arranged in a first direction. A second touch electrode includes a plurality of second sub-detection electrodes arranged in a second direction, which intersects the first direction. An electrode pattern connecting portion electrically connects adjacent second sub-detection electrode patterns. An island electrode pattern is disposed in the second touch electrode and is isolated from the first touch electrode. The first conductive layer includes a bridge pattern electrically connecting first sub-detection electrode patterns adjacent to the island electrode pattern. The insulating pattern does not overlap a part of the bridge pattern.

According to an exemplary embodiment of the present invention, a touch member includes a first touch electrode including a plurality of first sub-detection electrode patterns spaced apart from each other. A second touch electrode includes a plurality of second sub-detection electrodes spaced apart from each other. The second sub-detection electrodes are spaced apart from the first touch electrode patterns. An electrode pattern connecting portion electrically connects adjacent second sub-detection electrode patterns to each other. An island electrode pattern is disposed in the second touch electrode and is spaced apart from the first touch electrode. A bridge electrode electrically connects a first sub-detection electrode of the first sub-detection electrode patterns to the island electrode pattern. An insulating pattern is disposed between the bridge electrode and a portion of the first island electrode.

BRIEF DESCRIPTION OF THE DRAWINGS

The above and other exemplary embodiments and features of the present invention will become more apparent by describing in detail exemplary embodiments thereof with reference to the attached drawings, in which:

FIG. 1 is a plan view of an organic light-emitting diode (OLED) display device according to an exemplary embodiment of the present invention;

DETAILED DESCRIPTION

Figure 2:
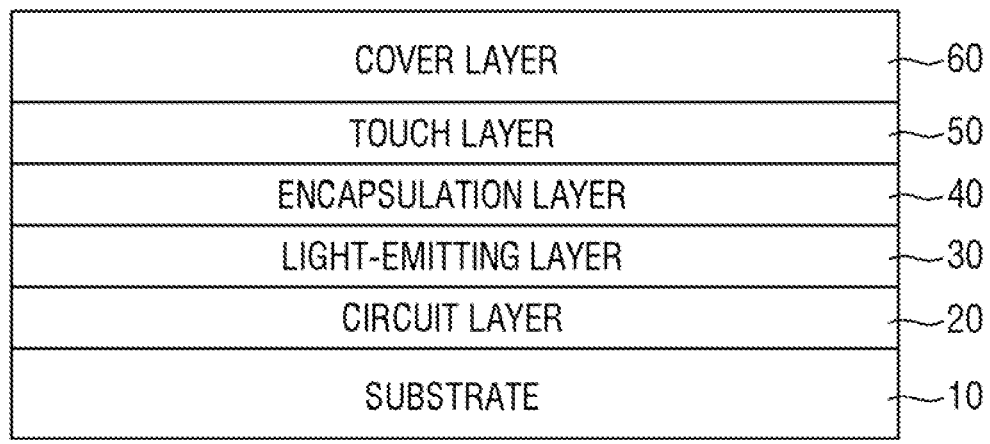
FIG. 2 is a schematic cross-sectional view of the OLED display device of FIG. 1.

Features of the present invention and methods of accomplishing the same may be understood more readily by reference to the following detailed description of embodiments and the accompanying drawings. Exemplary embodiments of the present invention may, however, be embodied in many different forms and should not be construed as being limited to the embodiments set forth herein.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Display devices according to an exemplary embodiment of the present invention, which are devices for displaying moving or still images or devices for displaying stereoscopic images, may be used not only as the displays of mobile electronic devices such as a mobile terminal, a smartphone, a tablet personal computer (PC), a smart watch, and a navigation device, but also as the displays of various other products such as a television (TV), a notebook computer, a monitor, a billboard, or an Internet of Things (IoT) device.

Exemplary embodiments of the present invention will be described in more detail below with reference to the accompanying drawings, taking an organic light-emitting diode (OLED) display device as an example, but the present invention is also applicable to various other display devices such as a field emission display device or an electrophoretic display device. In the specification and drawings, like reference numerals may refer to like elements.

As an example, a vertical direction is defined as a first direction D1, and a direction that intersects the first direction D1 is defined as a second direction D2. For example, the second direction D2 may correspond to a horizontal direction. However, the present invention is not limited to this, and the first and second directions D1 and D2 may be relative directions intersecting each other.

As an example, the first direction D1 may be perpendicular to the second direction D2. The first direction D1 and the second direction D2 may define a plane along which a display panel extends. A third direction D3 may be perpendicular to the first and second directions D1 and D2. Thus, the third direction D3 may be orthogonal to a plane extending in the first and second directions D1 and D2.

FIG. 1 is a plan view of an organic light-emitting diode (OLED) display device according to an exemplary embodiment of the present invention. FIG. 2 is a schematic cross-sectional view of the OLED display device of FIG. 1.

Referring to FIG. 1, an OLED display device 1 may include a display area DA and a non-display area NDA.

The display area DA may be defined as an area in which an image is displayed. The display area DA may be used as a detection member for detecting an external environment. For example, the display area DA may be used to display an image or to recognize a fingerprint of a user. In an exemplary embodiment of the present invention, the display area DA may have a substantially flat shape, but the present invention is not limited thereto. In an exemplary embodiment of the present invention, at least part of the display area DA may be bent.

The non-display area NDA may be disposed on the outside of the display area DA and may be defined as an area in which no image is displayed. In an exemplary embodiment of the present invention, a speaker module, a camera module, or a sensor module may be disposed in the non-display area NDA. In an exemplary embodiment of the present invention, the sensor module may include at least one of an illumination sensor, a proximity sensor, an infrared sensor, or an ultrasonic sensor. In an exemplary embodiment of the present invention, the non-display area NDA may have a substantially flat shape, but the present invention is not limited thereto. In an exemplary embodiment of the present invention, at least part of the non-display area NDA may be bent. For example, the display device may be a bendable or foldable display device that is in a curved or bent state at some times and is in a substantially flat state at other times. Alternatively, the display device may be in a permanently folded, curved or bent state.

The display area DA may have a rectangular shape extending longer in a first direction D1 than in a second direction D2. The non-display area NDA may have a rectangular shape with round corners. The non-display area NDA, like the display area DA, may extend longer in the first direction D1 than in the second direction D2. However, the shapes of the display area DA and the non-display area NDA are not particularly limited. In an exemplary embodiment of the present invention, the display area DA and the non-display area NDA may have various shapes other than a rectangular shape, such as a square shape, a polygonal shape other than a rectangular or square shape, a circular shape, or an elliptical shape.

As an example, the non-display region NDA may be arranged at four sides of the display region DA in a plan view (e.g., along the third direction D3); however, exemplary embodiments of the present invention are not limited thereto. For example, the non-display region NDA may be arranged at less than four sides (e.g., three sides) of the display region DA in a plan view.

Referring to FIG. 2, the OLED display device 1 may include a substrate 10, a circuit layer 20 disposed on the substrate 10, a light-emitting layer 30 disposed on the circuit layer 20, an encapsulation layer 40 disposed on the light-emitting layer 30, a touch layer 50 disposed on the encapsulation layer 40, and a cover layer 60 disposed on the touch layer 50. The structure of the OLED display device 1 of FIG. 2 is exemplary. Each of the layers of the OLED display device 1 may have a single- or multilayer structure. Some layers may be added to the OLED display device 1, or some of the layers of the OLED display device 1 may be omitted as desired. The terms "touch layer" and "touch member" may be used interchangeably herein.

The substrate 10 may be an insulating substrate. In an exemplary embodiment of the present invention, the substrate 10 may include glass, quartz, or a polymer resin. The polymer material may be polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polycarbonate (PC), cellulose triacetate (CAT), cellulose acetate propionate (CAP), or a combination thereof.

In an exemplary embodiment of the present invention, the substrate 10 may be a flexible substrate including polyimide (PI) or may have a stack of multiple films.

The circuit layer 20 may include circuitry for driving the light-emitting layer 30. For example, the circuit layer 20 may include a plurality of conductive lines, an insulating layer, and a plurality of thin-film transistors (TFTs). The TFT's may use amorphous silicon, polysilicon, low-temperature polysilicon (LTPS), an oxide semiconductor, or an organic semiconductor as their channel layers. The channel layers of the TFTs may be of different types. In an exemplary embodiment of the present invention, a TFT including an oxide semiconductor and a TFT including LTPS may both be included in one pixel unit in consideration of the functions of the corresponding TFTs and the order of processes.

A buffer layer may be disposed between the circuit layer 20 and the substrate 10. The buffer layer may be formed by stacking a single- or multilayer organic layer.

The light-emitting layer 30 may emit light in accordance with a driving signal received from the circuit layer 20. The light-emitting layer 30 may include a light-emitting element. In an exemplary embodiment of the present invention, the light-emitting layer 30 may have a structure in which a pixel electrode, an organic light-emitting layer, and a common electrode are sequentially stacked. The pixel electrode may be an anode electrode, and the common electrode may be a cathode electrode. The pixel electrode, the organic light-emitting layer, and the common electrode may form an OLED.

The encapsulation layer 40 may substantially cover the light-emitting layer 30. The encapsulation layer 40 may prevent moisture and air from infiltrating into the light-emitting layer 30. In an exemplary embodiment of the present invention, the encapsulation layer 40 may be formed as a multilayer film including at least one organic layer and at least one inorganic layer. In an exemplary embodiment of the present invention, the encapsulation layer 40 may include a first inorganic layer disposed on the common electrode, an organic layer disposed on the first inorganic layer, and a second inorganic layer disposed on the organic layer. The first and second inorganic layers may include at least one of silicon oxide (SiOx), silicon nitride (SiNx), or silicon oxynitride (SiONx), and the organic layer may include at least one of an acrylic resin, a methacrylic resin, polyisoprene, a vinyl resin, an epoxy resin, a urethane resin, a cellulose resin, a siloxane resin, a polyimide resin, or a perylene resin.

The touch layer 50 may be disposed on the encapsulation layer 40. The touch layer 50 may be a layer in which a touch member 50 for recognizing touch input from the user is provided. The touch member 50 will be described later in more detail below.

The cover layer 60 may be disposed on the touch layer 50. The cover layer 60 may protect the light-emitting layer 30, the circuit layer 20, or the touch layer 50 from scratches. In an exemplary embodiment of the present invention, the cover layer 60 may include a window member. The cover layer 60 may be attached to the touch layer 50 via an adhesive member such as an optically clear adhesive (OCA) or an optically clear resin (OCR).

An optical member such as an antireflection film or a polarization film may be provided on top of, or below, the cover layer 60.

The touch member 50 will be described in more detail below.

Figure 3:
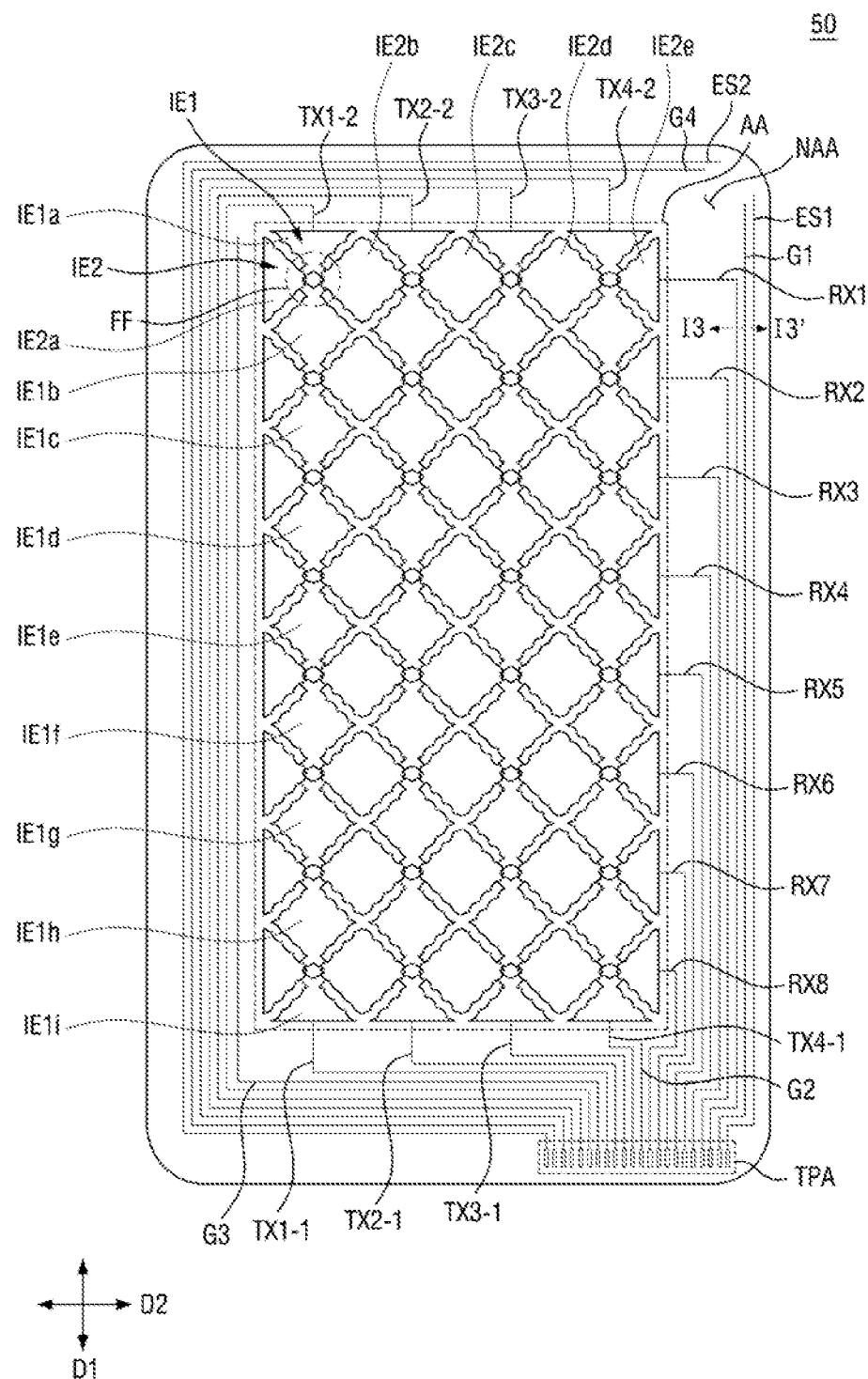
FIG. 3 is a schematic layout view of a touch member according to an exemplary embodiment of the present invention.
Figure 4:
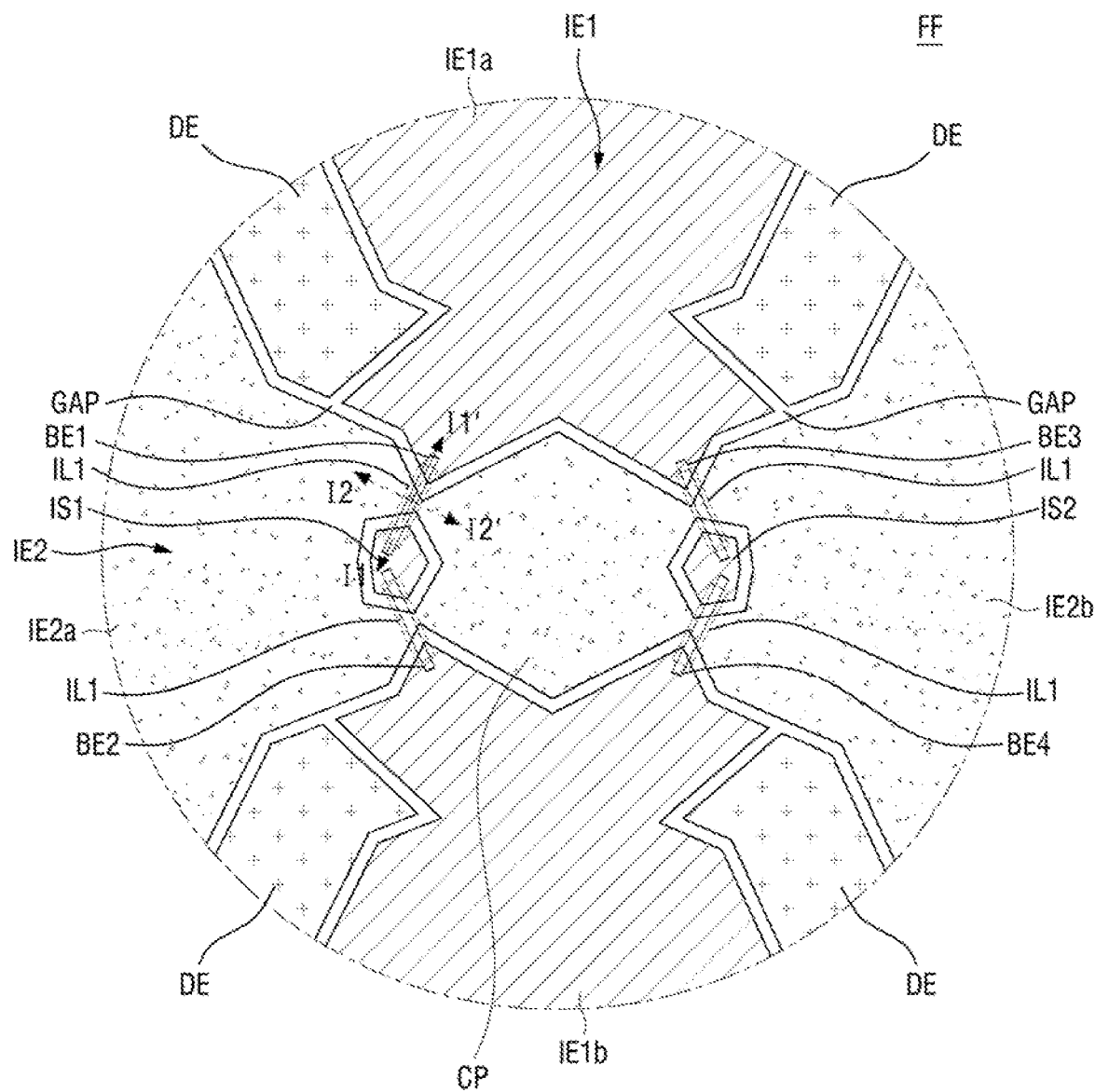
FIG. 4 is an enlarged view of an area FF of FIG. 3.
Figure 6:
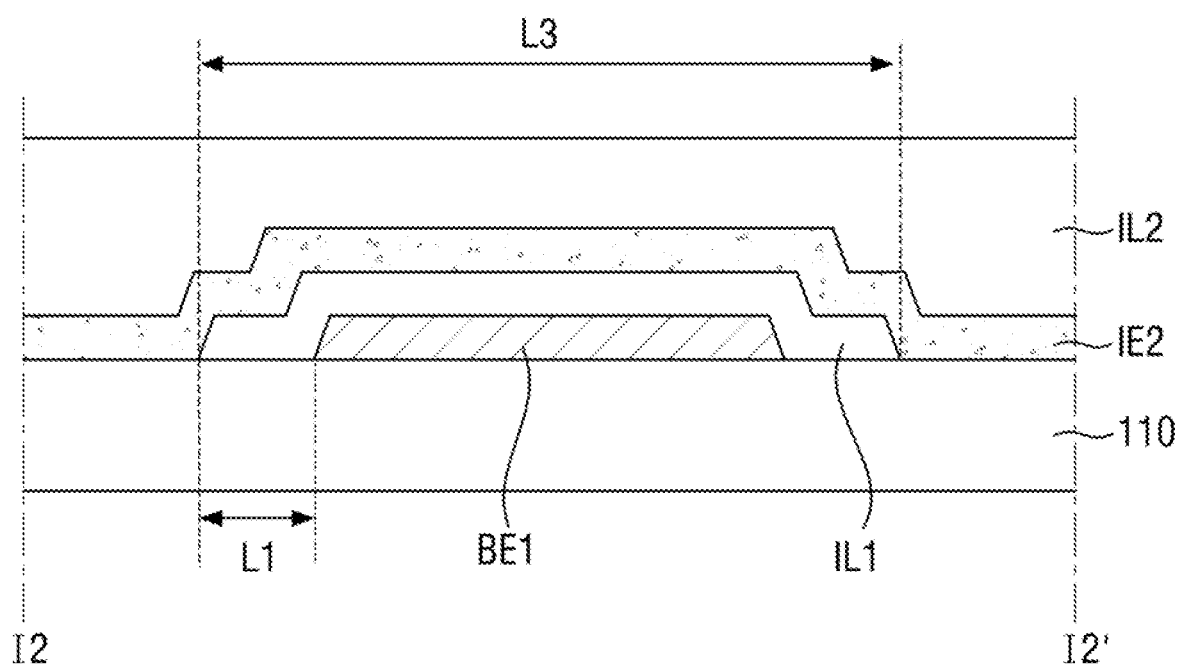
FIG. 6 is a cross-sectional view taken along line I2-I2' of FIG. 4.
Figure 7:
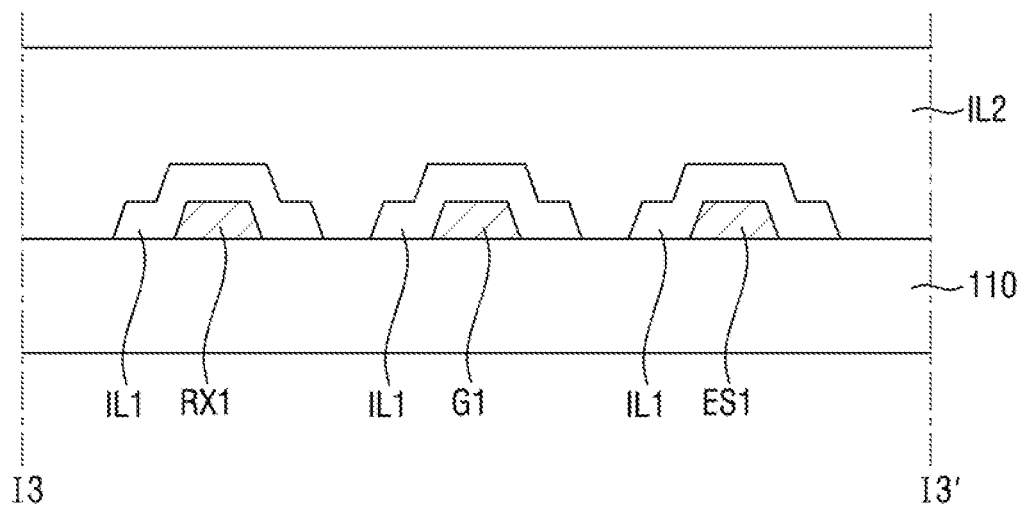
FIG. 7 is a cross-sectional view taken along line I3-I3' of FIG. 3.

FIG. 3 is a schematic layout view of a touch member according to an exemplary embodiment of the present invention. FIG. 4 is an enlarged view of an area FF of FIG. 3. FIG. is a cross-sectional view taken along line I1-I1' of FIG. 4. FIG. 6 is a cross-sectional view taken along line I2-I2' of FIG. 4. FIG. 7 is a cross-sectional view taken along line I3-I3' of FIG. 3.

Referring to FIG. 3, the touch member 50 may include an active area AA and an inactive area NAA. For clarity of description, the size of the inactive area NAA is slightly exaggerated.

The active area AA may be defined as an area in which touch input can be sensed. The active area AA may overlap with the display area DA (e.g., along the third direction D3). The expression "first and second elements overlapping with each other," as used herein, may mean that the first and second elements overlap with each other in the thickness direction of the substrate 10 of FIG. 2 (e.g., a vertical direction of FIG. 2, for example, along direction D3). The touch member 50 may include a plurality of detection electrodes (IE1 and IE2) in the active area AA.

The inactive area NAA, which is an area disposed on the outside of the active area AA, may be defined as an area in which no touch input is sensed. The inactive area NAA may overlap with the non-display area NDA (e.g., along the third direction D3). The touch layer 60 may include touch signal lines (TX1-1 through TX4-1, TX1-2 through TX4-2, and RX1 through RX8) connected, in the inactive area NAA, to the detection electrodes (IE1 and IE2) and a touch signal line pad area TPA connected to the touch signal lines (TX1-1 through TX4-1, TX1-2 through TX4-2, and RX1 through RX8).

Referring to FIGS. 3 and 4, in the active area AA, the touch member 50 may include a first detection electrode IE1 and a second detection electrode IE2. The touch member 50 may further include island electrodes (IS1 and IS2) disposed in the second detection electrode IE2 and bridge electrodes (BE1 through BE4) physically connecting the first detection electrode IE1 and the island electrodes (IS1 and IS2). The touch member 50 may further include dummy detection electrodes DE disposed between the first and second detection electrodes IE1 and IE2. The dummy detection electrodes DE may be omitted, as desired.

One of the first and second detection electrodes IE1 and IE2 may be a driving electrode, and the other detection electrode may be a sensing electrode. In the description that follows, as an example, the first detection electrode IE1 is a driving electrode and the second detection electrode IE2 is a sensing electrode.

The first detection electrode IE1 may extend in the first direction D1. The expression "a detection electrode extends," as used herein, might not only mean that the detection electrode, which has a particular thickness and length, extends in its longitudinal direction, but also may mean that if the detection electrode includes a plurality of sub-detection electrodes that are not physically connected to one another, the detection electrode extends in a direction in which the plurality of sub-detection electrodes are arranged. The first detection electrode IE1 may be arranged in the second direction D2.

The second detection electrode IE2 may extend in the second direction D2, which intersects the direction in which the first detection electrode IE1 extends (e.g., the first direction D1). The second detection electrode IE2 may extend in such a manner that the first detection electrode IE1 can be divided into a plurality of sub-detection electrodes (IE1a through IE1i). The second detection electrode IE2 may be arranged in the first direction D1.

FIG. 3 illustrates that four first detection electrodes IE1 and eight second detection electrodes IE2 are provided, and that each first detection electrode IE1 has nine sub-detection electrodes (IE1a through IE1i), as an example. However, the number of first detection electrodes IE1, the number of second detection electrodes IE2, the number of sub-detection electrodes of each first detection electrode IE1, and the number of sub-detection electrodes of each second detection electrode IE2 are not particularly limited.

Referring to FIG. 4, the first detection electrode IE1 may include a plurality of sub-detection electrodes (IE1a through IE1i). The first detection electrode IE1 may include a pair of sub-detection electrodes disposed at opposite ends of the first detection electrode IE1 and a number of sub-detection electrodes disposed between the pair of sub-detection electrodes. For example, the first detection electrode IE1 may include a first sub-detection electrode IE1a connected to a touch driving line and disposed at a side of the first detection electrode IE1, a ninth sub-detection electrode IE1i connected to another touch driving line and disposed at another side of the first detection electrode IE1, and second through eighth sub-detection electrodes IE1b through IE1h disposed between the first and ninth sub-detection electrodes IE1a and IE1i. The first sub-detection electrode IE1a may be connected to one of a plurality of touch driving lines (TX1-1 through TX4-1 and TX1-2 through TX4-2). The ninth sub-detection electrode IE1i may be connected to a different touch driving line from the first sub-detection electrode IE1i. The first through ninth sub-detection electrodes IE1a through IE1i may be physically isolated from one another.

The second through eighth sub-detection electrodes IE1b through IE1h may be substantially rhombic in shape. As an example, the second through eighth sub-detection electrodes IE1b through IE1h may substantially have a rhombic shape with sides in a zigzag shape.

The first and ninth sub-detection electrodes IE1a and IE1i may have a shape obtained by cutting the shape of the second through eighth sub-detection electrodes IE1b through IE1h into halves along the horizontal diagonal. For example, the first and ninth sub-detection electrodes IE1a and IE1i may substantially have the shape of an equilateral triangle obtained by cutting a rhombus along the horizontal diagonal, in which the two equal sides of the equilateral triangle may be in a zigzag shape and the base of the equilateral triangle may be in a rectilinear shape. The touch driving lines to which the first and ninth sub-detection electrodes IE1a and IE1i are connected may be in direct physical contact with the rectilinear bases of the first and ninth sub-detection electrodes IE1a and IE1i.

Referring again to FIG. 4, the second detection electrode IE2 may include a plurality of sub-detection electrodes (IE2a through IE2e) and a connecting portion CP. In the second detection electrode IE2, a pair of adjacent sub-detection electrodes, for example, first and second sub-detection electrodes IE2a and IE2b, may be physically connected by the connecting portion CP. The second detection electrode IE2 may include a plurality of sub-detection electrodes (IE2a through IE2e) that are directly physically connected to one another via connecting portion CP, whereas the first detection electrode IE1 may include the first through ninth sub-detection electrodes IE1a through IE1i that are physically isolated from one another. For example, the second detection electrode IE2 may include a first sub-detection electrode IE2a disposed at a side of the second detection electrode IE2, a fifth sub-detection electrode IE2e disposed at another side of the second detection electrode IE2, and second through fourth sub-detection electrodes IE2b through IE2d disposed between the first and fifth sub-detection electrodes IE2a and IE2e.

A pair of adjacent sub-detection electrodes of the second detection electrode IE2 may physically isolate a pair of adjacent sub-detection electrodes of the first detection electrode IE1 that are disposed adjacent to the pair of adjacent sub-detection electrodes of the second detection electrode IE2. For example, referring to FIG. 4, the first and second sub-detection electrodes IE2a and IE2b of the second detection electrode IE2 may physically isolate the first and second sub-detection electrodes IE1a and IE1b of the first detection electrode IE1 that are disposed adjacent to the first and second sub-detection electrodes IE2a and IE2b, and the connecting portion CP may be disposed between the first and second sub-detection electrodes IE1a and IE1b of the first detection electrode IE1 to connect the first and second sub-detection electrodes IE2a and IE2b of the second detection electrode IE2.

The second through fourth sub-detection electrodes IE2b through IE2d of the second detection electrode IE2, like the second through eighth sub-detection electrodes IE1b through IE1h of the first detection electrode IE1, may substantially have a rhombic shape with sides in a zigzag shape. The first and fifth sub-detection electrodes IE2a and IE2e of the second detection electrode IE2, like the first and ninth sub-detection electrodes IE1a and IE1i of the first detection electrode IE1, may substantially have the shape of an equilateral triangle with two equal sides in a zigzag shape and a rectilinear base.

If the first and second detection electrodes IE1 and IE2 have a matrix shape or the sides of each of the first and second detection electrodes IE1 and IE2 are in a rectilinear shape, moiré can be seen by the user. However, since each of the first and second detection electrodes IE1 and IE2 have a zigzag shape on the sides thereof, any display defects that can be caused by moiré can be reduced or eliminated.

The touch member 50 may include one or more island electrodes (IS1 and IS2) disposed in, and physically isolated from, the second detection electrode IE2. A pair of adjacent sub-detection electrodes of the first detection electrode IE1 may be electrically connected to one or more island electrodes (IS1 and IS2) disposed adjacent to the pair of adjacent sub-detection electrodes.

As an example, referring to FIG. 4, the touch member 50 may include first and second island electrodes IS1 and IS2 between the first and second sub-detection electrodes IE1a and IE1b of the first detection electrode IE1. The first sub-detection electrode IE1a of the first detection electrode IE1 and the first island electrode IS1 may be electrically connected to each other via a first bridge electrode BE1, and the second sub-detection electrode IE1b of the first detection electrode IE1 and the second island electrode IS2 may be electrically connected to each other via a second bridge electrode BE2. The first sub-detection electrode IE1a of the first detection electrode IE1 and the second island electrode IS2 may be electrically connected to each other via a third bridge electrode BE3, and the second sub-detection electrode IE1b of the first detection electrode IE1 and the second island electrode IS2 may be electrically connected to each other via a fourth bridge electrode BE4. The first and second sub-detection electrodes IE1a and IE1b of the first detection electrode IE1 may be electrically connected to each other via the first through fourth bridge electrodes BE1 through BE4, which are physically connected to the first and second island electrodes IS1 and IS2 with the first and second island electrodes IS1 and IS2 disposed therebetween.

As described above, the touch member 50 may include two island electrodes between the first and second sub-detection electrodes IE1a and IE1b of the first detection electrode IE1. Thus, even when any one of the first through fourth bridge electrodes BE1 through BE4 is disconnected, the first and second sub-detection electrodes IE1a and IE1b of the first detection electrode IE1 can still be electrically connected to each other.

The first island electrode IS1 may be disposed in the second detection electrode IE2 between the first sub-detection electrode IE2a of the second detection electrode IE2 and a connecting portion CP. The second island electrode IE2 may be disposed in the second detection electrode IE2 between the second sub-detection electrode IE2b of the second detection electrode IE2 and the connecting portion CP. For example, the first island electrode IS1 may be disposed on a side, in the first direction D1, of the connecting portion CP, and the second island electrode IS2 may be disposed on another side, in the first direction D1, of the connecting portion CP.

The first and second island electrodes IS1 and IS2 may be disposed at the center of a region closest to the first and second sub-detection electrodes IE1a and IE1b of the first detection electrode IE1, but the locations of the first and second island electrodes IS1 and IS2 in the second sub-detection electrode IE2 are not particularly limited. The first and second island electrodes IS1 and IS2 may be disposed in the connecting portion CP. As an example, the first and second island electrodes IS1 and IS2 may be disposed in the middle of the first and second sub-detection electrodes IE2a and IE2b of the second detection electrode IE2.

The first and second island electrodes IS1 and IS2 may have a diamond shape, but the present invention is not limited thereto. For example, the first and second island electrodes IS1 and IS2 may have various other shapes such as a square shape, a polygonal shape other than a diamond or square shape, a circular shape, or an elliptical shape.

In a case where the first and second sub-detection electrodes IE1a and IE1b of the first detection electrode IE1 are connected via the first and second island electrodes IS1 and IS2, the margin of the first through fourth bridge electrodes BE1 through BE4 can be reduced as compared to a case where the first and second sub-detection electrodes IE1a and IE1b of the first detection electrode IE1 are directly connected without the aid of the first and second island electrodes IS1 and IS2. For example, the length of the first through fourth bridge electrodes BE1 through BE4 can be reduced. As a result, transmittance accuracy and reliability can be increased by reducing the size of a part of a pixel region that can be hidden from view by the first through fourth bridge electrodes BE1 through BE4. Also, since the contact area between the first detection electrode IE1 and the first through fourth bridge electrodes BE1 through BE4 increases, the contact resistance between the first detection electrode IE1 and the first through fourth bridge electrodes BE1 through BE4 can be reduced.

According to an exemplary embodiment of the present invention, a touch member may include a first touch electrode including a plurality of first sub-detection electrode patterns (e.g., first sub-detection electrode patterns IE1a and IE1b) spaced apart from each other. A second touch electrode may include a plurality of second sub-detection electrodes (e.g., second sub-detection electrodes IE2a and IE2b) spaced apart from each other. The second sub-detection electrodes may be spaced apart from the first touch electrode patterns. The electrode pattern connecting portion CP may electrically connect adjacent second sub-detection electrode patterns to each other. An island electrode pattern (e.g., island electrode pattern IS1) may be disposed in the second touch electrode and may be spaced apart from the first touch electrode. A bridge electrode (e.g., bridge electrode BE2) may electrically connect a first sub-detection electrode of the first sub-detection electrode patterns to the island electrode pattern. An insulating pattern (e.g., insulating pattern IL1) may be disposed between the bridge electrode and a portion of the first island electrode (see, e.g., FIG. 5). According to an exemplary embodiment of the present invention, an extending distance of the bridge electrode may be greater than an extending distance of the insulating pattern. As an example, an outermost edge of the bridge electrode may be spaced apart from an outermost edge of the insulating pattern (see, e.g., FIG. 5).

The connections between the first detection electrode IE1, the second detection electrode IE2, the first and second island electrodes IS1 and IS2, and the first through fourth bridge electrodes BE1 through BE4 will be described in more detail below. For clarity of description, the connections between the first detection electrode IE1, the second detection electrode IE2, the first island electrode IS1, and the first bridge electrode BE1 will be described with reference to FIGS. 5 and 6, as an example.

Figure 5:
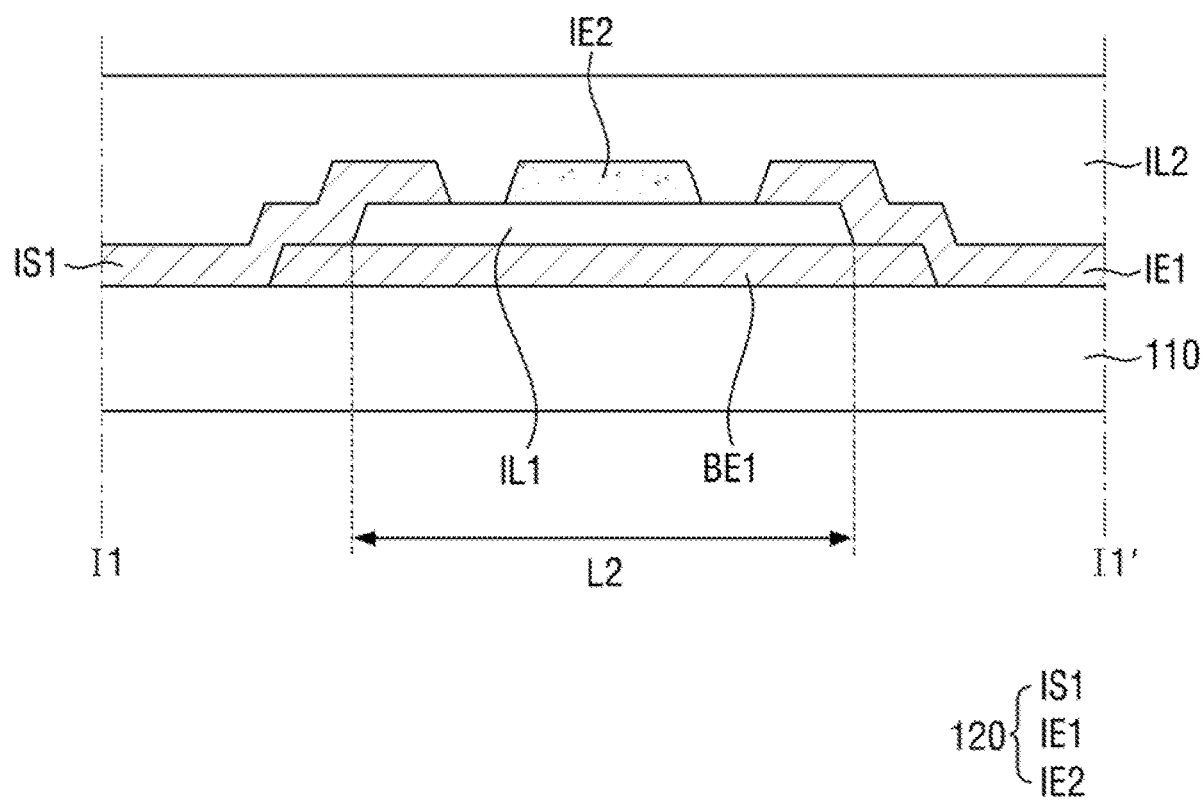
FIG. 5 is a cross-sectional view taken along line I1-I1' of FIG. 4.

Referring to FIGS. 5 and 6, the touch member 50 may include a base 110, the first bridge electrode BE1 disposed on the base 110, an insulating pattern disposed on the first bridge electrode BE1, a detection electrode layer 120 disposed on the insulating pattern IL1, and an upper insulating layer IL2 disposed on the detection electrode layer 120. The detection electrode layer 120 may include the first detection electrode IE1, the second detection electrode IE2, and the first island electrode IS1. For example, the first detection electrode IE1, the second detection electrode IE2, and the first island electrode IS1 may be disposed in the same layer. As an example, the insulating pattern IL1 may extend along an upper surface of the first bridge electrode BE1. The insulating pattern IL1 might have a shorter length than a length of the first bridge electrode BE1.

The base 110 may include glass or plastic such as polyethylene terephthalate, polyimide, polycarbonate, polyethylene (PE), polypropylene (PP), polysulfone (PSF), polymethyl methacrylate (PMMA), triacetyl cellulose (TAC), or a cycloolefin polymer (COP).

The first bridge electrode BE1 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), calcium (Ca), titanium (Ti), tantalum (Ta), tungsten (W), or copper (Cu). The first bridge electrode BE1 may be formed as a single-layer film or as a multilayer film.

The insulating pattern IL1 may be disposed on the first bridge electrode BE1 and may be formed to expose a part of the first bridge electrode BE1. For example, the insulating pattern IL1 may be formed to expose both end portions of the first bridge electrode BE1. The touch member 50 may include more than one insulating pattern IL1. The insulating pattern IL1 may insulate the first bridge electrode BE1 and the second detection electrode IE2. The insulating pattern IL1 may include a silicon compound or a metal oxide. For example, the insulating pattern IL1 may include silicon oxide, silicon nitride, silicon oxynitride, aluminum oxide, tantalum oxide, hafnium oxide, zirconium oxide, or titanium oxide. These silicon compounds and metal oxides may be used alone or in combination with one another. The insulating pattern IL1 may be a single-layer film or a multilayer film having a stack of different materials.

The insulating pattern IL1 may be disposed only in a minimum portion of the touch member 50 to the extent that the second detection electrode IE2 and the first bridge electrode BE1 can be insulated from each other. Thus, the insulating pattern IL1 may be disposed between the second detection electrode IE2 and the first bridge electrode BE1. The insulating pattern IL1 may extend a relatively small distance beyond side surfaces of the second detection electrode IE2. As an example, a plurality of insulating patterns IL1 that are isolated from one another may be provided. In the active area AA, there may be provided as many insulating patterns IL1 as there are bridge electrodes, and in an entire area including both the active area AA and the inactive area NAA, there may be provided more insulating patterns IL1 than there are bridge electrodes. The area occupied by the insulating patterns IL1 may be less than about 2% of the area of the base 110. As an example, the area occupied by the insulating patterns IL1 may be less than about 2% of the area of the substrate 10.

Referring again to FIGS. 5 and 6, the insulating pattern IL1 disposed on the first bridge electrode BE1 may have a rectangular shape in a plan view. The insulating pattern IL1 may extend in a third direction, which is the direction in which the first bridge electrode BE1 extends. The third direction may be different from the first direction D1 or the second direction D2, but the present invention is not limited thereto. Alternatively, the third direction may be the same as the first direction D1. In a plan view, the insulating pattern IL1 may have a long side L2 extending in the third direction and a short side L3 extending in a fourth direction that intersects the third direction. The length of the long side L2 of the insulating pattern IL1 may be smaller than the length of the first bridge electrode BE1, and the length of the short side L3 of the insulating pattern IL1 may be greater than the width of the first bridge electrode BE1.

The long side L2 of the insulating pattern IL1 may have a length of from about 60 μm to about 80 μm, and the short side L3 of the insulating pattern IL1 may have a length of from about 12 μm to about 18 μm. A distance L1 between one edge of the first bridge electrode BE1 and a side of the insulating pattern IL1 closest to the corresponding edge of the first bridge electrode BE1 may be about 5 μm or less. For example, the difference between the length of the short side L3 of the insulating pattern IL1 and the width of the first bridge electrode BE1 may be about 10 μm or less.

Is Since the insulating patterns IL1 is provided to occupy a relatively small area, panel warpage can be reduced or eliminated in the OLED display device 1. Thus, reliability and longevity of the OLED display device may be increased. This will be described in more detail below (e.g., with reference to FIGS. 8 and 9).

The detection electrode layer 120 may include a conductive material. The detection electrode layer 120 may include a transparent conductive oxide such as indium tin oxide (ITO), indium zinc oxide (IZO), zinc oxide (ZnO), or indium tin zinc oxide (ITZO). The first detection electrode IE1, the second detection electrode IE2, and the first and second island electrodes IS1 and IS2 may be formed of the same material.

The first detection electrode IE1 and the first island electrode IS1 may be disposed on the insulating pattern IL1 with the second detection electrode IE2 disposed therebetween. The first detection electrode IE1 and the first island electrode IS1 may extend even to areas where the insulating pattern IL1 is not disposed. Thus, the first detection electrode IE1 and the first island electrode IS1 may be formed to be in direct physical contact with the exposed end portions of the first bridge electrode BE1 and with a part of the base 110. For example, the first detection electrode IE1 and the first island electrode IE1 may be in direct contact with the first bridge electrode BE1 and may be electrically connected to each other via the first bridge electrode BE1.

The upper insulating layer IL2 may substantially cover the detection electrode layer 120. The upper insulating layer IL2 may be disposed on substantially the entire surface of the base 110. The upper insulating layer IL2 may include the same material as the insulating pattern IL1 or may include at least one selected from among the aforementioned exemplary materials of the insulating pattern IL1. The upper insulating layer IL2 may be a single-layer film or a multilayer film having a stack of different materials.

Referring again to FIG. 4, dummy electrodes DE may be disposed between the first and second detection electrodes IE1 and IE2. The dummy detection electrodes DE may be disposed in the detection electrode layer 120. For example, the dummy detection electrodes DE may be disposed in the same layer as, and patterned together with, the first and second detection electrodes IE1 and the first and second island electrodes IS1 and IS2. The dummy detection electrodes DE may be formed of the same material as the first and second detection electrodes IE1 and IE2 and the first and second island electrodes IS1 and IS2.

The dummy detection electrodes DE may be formed during the formation of the first and second detection electrodes IE1 and IE2 and the first and second island electrodes IS1 and IS2. The first and second detection electrodes IE1 and IE2 and the first and second island electrodes IS1 and IS2 may be formed by being separated from a single integral electrode disposed in the detection electrode layer 120. As an example, the first and second detection electrodes IE1 and IE2 and the first and second island electrodes IS1 and IS2 may be separated, through etching, from an integral conductive electrode that is formed of at least one of the aforementioned exemplary materials of the first and second detection electrodes IE1 and IE2. To control the area of each of the sub-detection electrodes (IE1a through IE1i) of the first detection electrode IE1 and the area of each of the sub-detection electrodes (IE2a through IE2e) of the second detection electrode IE2 during etching, the dummy detection electrodes DE may be formed between the first and second detection electrodes IE1 and IE2. As a result of etching, the first and second detection electrodes IE1 and IE2, the first and second island electrodes IS1 and IS2, and the dummy detection electrodes DE may be physically separate from one another, and there may exist gaps between the first and second detection electrodes IE1 and IE2, the first and second island electrodes IS1 and IS2, and the dummy detection electrodes DE. The dummy detection electrodes DE might not be provided as desired.

The sub-detection electrodes (IE1a through IE1i) of the first detection electrode IE1 and the sub-detection electrodes (IE2a through IE2e) of the second detection electrode IE2 may form unit sensing areas. In each of the unit sensing areas, the capacitances between the sub-detection electrodes (IE1a through IE1i) of the first detection electrode IE1 and the sub-detection electrodes (IE2a through IE2e) of the second detection electrode may be measured, thus determining the presence of touch input and calculating the coordinates of touch input. Touch sensing may be performed in a mutual capacitive manner, but the present invention is not limited thereto. The size of the unit sensing areas may be greater than the area of pixel electrodes. For example, each of the unit sensing areas may correspond to multiple OLEDs. Each of the unit sensing areas may have a length of from about 4 mm to about 5 mm, but the present invention is not limited thereto.

Referring again to FIG. 3, in the inactive area NAA, the touch signal lines (TX1-1 through TX4-1, TX1-2 through TX4-2, and RX1 through RX8) may be disposed. Each of the touch signal lines (TX1-1 through TX4-1, TX1-2 through TX4-2, and RX1 through RX8) may extend from the touch signal line pad area TPA to the inactive area NAA and may be connected to the detection electrodes (IE1 and IE2).

The touch signal lines (TX1-1 through TX4-1, TX1-2 through TX4-2, and RX1 through RX8) may include a plurality of touch driving lines (TX1-1 through TX4-1 and TX1-2 through TX4-2) and a plurality of touch sensing lines (RX1 through RX8). The touch signal lines (TX1-1 through TX4-1, TX1-2 through TX4-2, and RX1 through RX8) may further include guard lines (G1 through G4) and/or ground lines (ES1 and ES2).

The first detection electrode IE1 may be connected to the touch driving lines (TX1-1 through TX4-1 and TX1-2 through TX4-2). In an exemplary embodiment of the present invention, the first detection electrode IE1 may be connected to multiple touch driving lines. For example, the touch driving lines (TX1-1 through TX4-1 and TX1-2 through TX4-2) may include the first touch driving lines TX1-1 through TX4-1 and the second touch driving lines TX1-2 through TX4-2, one of the first touch driving lines TX1-1 through TX4-1 may be connected to a lower end of the first detection electrode IE1, and one of the second touch driving lines TX2-1 through TX4-2 may be connected to an upper end of the first detection electrode IE1. The first touch driving lines TX1-1 through TX4-1 may extend from the touch signal line pad area TPA in the first direction D1 and may be connected to the lower ends of their respective first detection electrodes IE1. The second touch driving lines TX1-2 through TX4-2 may extend from the touch signal line pad area TPA in the first direction D1 and may be connected to the upper ends of their respective first detection electrodes IE1 by bypassing the left edge of the active area AA.

The second detection electrode IE2 may be connected to the touch sensing lines (RX1 through RX8). In an exemplary embodiment of the present invention, the second detection electrode IE2 may be connected to one of the touch sensing lines (RX1 through RX8). The touch sensing lines (RX1 through RX8) may extend from the touch signal line pad area TPA to the right edge of the active area AA in the first direction D1 and may be connected to the right ends of their respective second detection electrodes IE2.

The second detection electrode IE2 may be connected to a single touch sensing line, but the first detection electrode IE1 may be connected to multiple touch driving lines. A driving voltage signal provided to the first detection electrode IE1 may have a higher voltage than a sensing voltage signal provided to the second detection electrode IE2. The voltage in a detection electrode may vary from one area to another area in the detection electrode, depending on the location of lines connected to the detection electrode, when a signal with a relatively high voltage is applied to the detection electrode. For example, if a touch driving line is connected to one end of the first detection electrode IE1, but no touch driving line is connected to the other end of the first detection electrode IE1, the voltage at the end of the first detection electrode IE1 to which the touch driving line is connected may differ from the voltage at the other end of the first detection electrode IE1. However, since the first detection electrode IE1 is connected to multiple touch driving lines, the difference in voltage between both ends of the first detection electrode IE1 can be minimized. The number of touch driving lines connected to the first detection electrode IE1 is not particularly limited, and alternatively, only one touch driving line may be connected to the first detection electrode IE1.

The ground lines (ES1 and ES2) may be disposed on the outside of the touch signal lines (TX1-1 through TX4-1, TX1-2 through TX4-2, and RX1 through RX8). In an exemplary embodiment of the present invention, the ground lines (ES1 and ES2) may include first and second ground lines ES1 and ES2. The first and second ground lines ES1 and ES2 may surround a touch area and signal lines in a ring shape. The first and second ground lines ES1 and ES2 might not be connected to each other.

The first ground line ES1 may surround the touch signal lines (RX1 through RX8), which are disposed on the right side of the touch member 50 and extend in the second direction D2 in the lower part of the touch area.

The second ground line ES2 may surround the touch driving lines (TX1-1 through TX4-1 and TX1-2 through TX4-2), which are disposed on the left side of the touch member 50 and extend in the second direction D2 in the upper and lower parts of the touch area.

The ground lines (ES1 and ES2) may be lines where a first reference voltage signal flows. The ground lines (ES1 and ES2) can alleviate electrostatic shock that can be applied to the touch signal lines (TX1-1 through TX4-1, TX1-2 through TX4-2, and RX1 through RX8) from the outside.

The guard lines (G1 through G4) may be disposed between the touch signal lines (TX1-1 through TX4-1, TX1-2 through TX4-2, and RX1 through RX8) and/or between the touch signal lines (TX1-1 through TX4-1, TX1-2 through TX4-2, and RX1 through RX8) and the ground lines (ES1 and ES2). The guard lines (G1 through G4) may include first, second, third, and fourth guard lines G1, G2, G3, and G4.

The first guard line G1 may be disposed between the touch sensing lines (RX1 through RX8) and the first ground line ES1.

The second guard line G2 may be disposed between the touch driving lines (TX1-1 through TX4-1 and TX1-2 through TX4-2) and the touch sensing lines (RX1 through RX8).

The third guard line G3 may be disposed between the first touch driving lines TX1-1 through TX4-1 and the second touch driving lines TX1-2 through TX4-2.

The fourth guard line G4 may be disposed between the second touch driving lines TX1-2 through TX4-2 and the second ground line ES2.

The guard lines (G1 through G4) may be lines where a second reference voltage signal flows. The guard lines (G1 through G4) may prevent signal interference that may occur between a pair of adjacent lines. For example, the first guard line G1 may prevent signal interference between the touch sensing lines (RX1 through RX8) and the first ground line ES1, the second guard line G2 may prevent signal interference between the touch driving lines (TX1-1 through TX4-1 and TX1-2 through TX4-2) and the touch sensing lines (RX1 through RX8), the third guard line G3 may prevent signal interference between the first touch driving lines TX1-1 through TX4-1 and the second touch driving lines TX1-2 through TX4-2, and the fourth guard line G4 may prevent signal interference between the second touch driving lines TX1-2 through TX4-2 and the second ground line ES2.

Referring to FIGS. 3 and 7, in the inactive area NAA, the touch signal lines (TX1-1 through TX4-1, TX1-2 through TX4-2, and RX1 through RX8), the ground lines (ES1 and ES2), and the guard lines (G1 through G4) may be disposed on the base 110 to be isolated from one another. The touch signal lines (TX1-1 through TX4-1, TX1-2 through TX4-2, and RX1 through RX8), the ground lines (ES1 and ES2), and the guard lines (G1 through G4) may be disposed in the same layer as the first bridge electrode BE1, and may be formed of the same material as the first bridge electrode BE1.

The insulating patterns IL1 may be disposed on the touch signal lines (TX1-1 through TX4-1, TX1-2 through TX4-2, and RX1 through RX8), the ground lines (ES1 and ES2), and the guard lines (G1 through G4). The insulating patterns IL1 might not be integrally formed to cover the touch signal lines (TX1-1 through TX4-1, TX1-2 through TX4-2, and RX1 through RX8), the ground lines (ES1 and ES2), and the guard lines (G1 through G4) all together as a whole, but may be formed individually to substantially cover the touch signal lines (TX-1 through TX4-1, TX1-2 through TX4-2, and RX1 through RX8), the ground lines (ES1 and ES2), and the guard lines (G1 through G4) separately. For example, in the inactive area NAA, there may be provided as many insulating patterns IL1 as there are touch signal lines (TX1-L through TX4-1, TX1-2 through TX4-2, and RX1 through RX8), ground lines (ES1 and ES2), and guard lines (G1 through G4). By minimizing the area occupied by the insulating patterns IL1 not only in the active area AA, but also in the inactive area NAA, panel warpage can be prevented in the non-display area NDA. Thus, reliability and longevity of a display panel according to an exemplary embodiment of the present invention may be increased.

The insulating patterns IL1 and panel warpage will be described in more detail below with reference to FIGS. 8 and 9.

Figure 8:
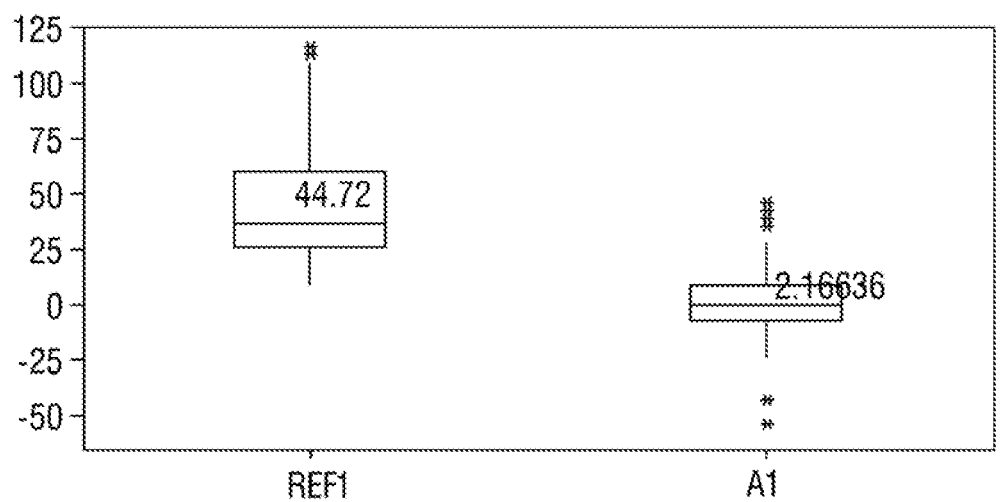
FIG. 8 is a graph showing exemplary degrees of panel warpage.

FIG. 8 is a graph showing the degree of panel warpage. FIG. 9 is a graph showing the results of a drop experiment.

Referring to FIG. 8, the x axis shows a comparative example REF1 and an experimental example A1, and the y axis represents the degree or the height (in micrometers) to which edges of an encapsulation film warp as compared to the center of the encapsulation film. The graph of FIG. 8 shows measurements obtained by experimenting each of the comparative example REF1 and the experimental example A1 50 times.

For example, the OLED display device 1 including an upper insulating layer IL2 having a long-side length of 70.5 μm and a short-side length of 13.6 μm and having a distance L1 of 5 μm, which is the distance between one edge of the first bridge electrode BE1 and a side of the insulating pattern IL1 closest to the corresponding edge of the first bridge electrode BE1, was used as the experimental example A1.

An OLED display device having insulating patterns IL1 disposed on substantially the entire surface of a base 110 was used as the comparative example REF1.

The experimental example A1 shows a panel warpage of about 2.17 μm. The comparative example REF1 shows a panel warpage of about 44.72 μm.

Figure 9:
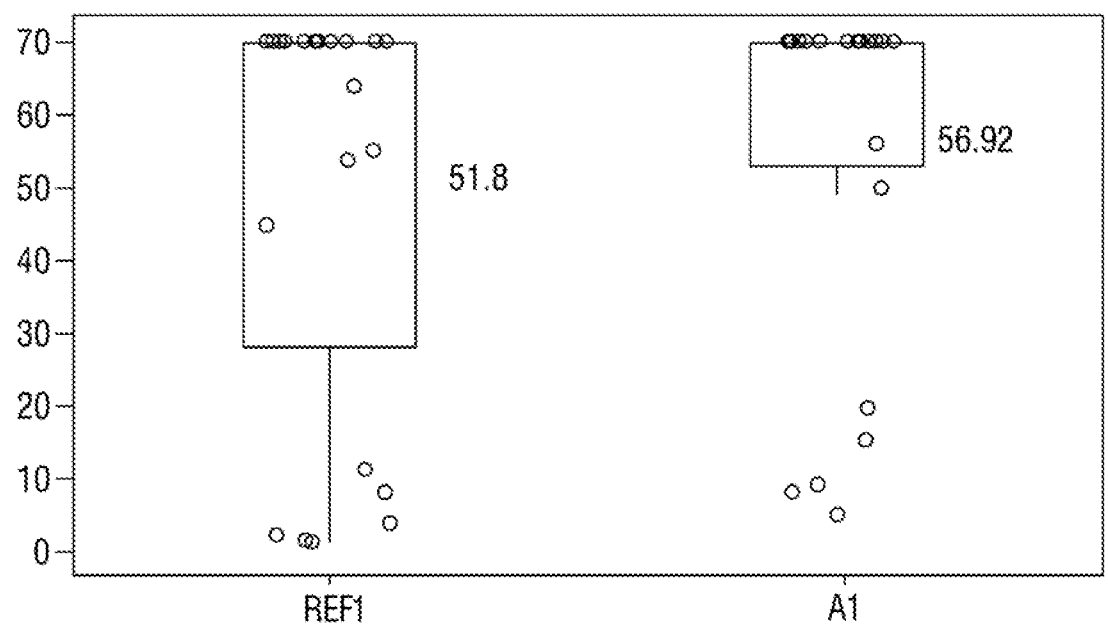
FIG. 9 is a graph showing exemplary results of a drop experiment.

Referring to FIG. 9, the dropping strength of the experimental example A1 and the comparative example A1 was measured by counting the number of times that the experimental example A1 and the comparative example REF1 were able to withstand being dropped without being damaged. The experimental example A1 and the comparative example REF1 were experimented under the same conditions. The y axis represents the number of drops after which damage to each of the experimental example A1 and the comparative example REF1 began.

The experimental example A1 was damaged after an average of about 56.92 drops. On the other hand, the comparative example REF1 was damaged after an average of about 51.8 drops.

Referring to FIGS. 8 and 9, the OLED display device 1 in which the insulating patterns IL1 are formed to be isolated from one another to have a minimum area has reduced panel warpage and increased product strength as compared to an OLED display device in which insulating patterns IL1 are formed on the entire surface of a base 110.

OLED display devices according to an exemplary embodiment of the present invention will be described in more detail below, focusing mainly on differences (particularly, in their touch members) with the OLED display device 1 of FIGS. 1 through 9. In FIGS. 1 through 24, like reference numerals indicate like elements, and thus, duplicative descriptions thereof may be omitted. Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

Figure 10:
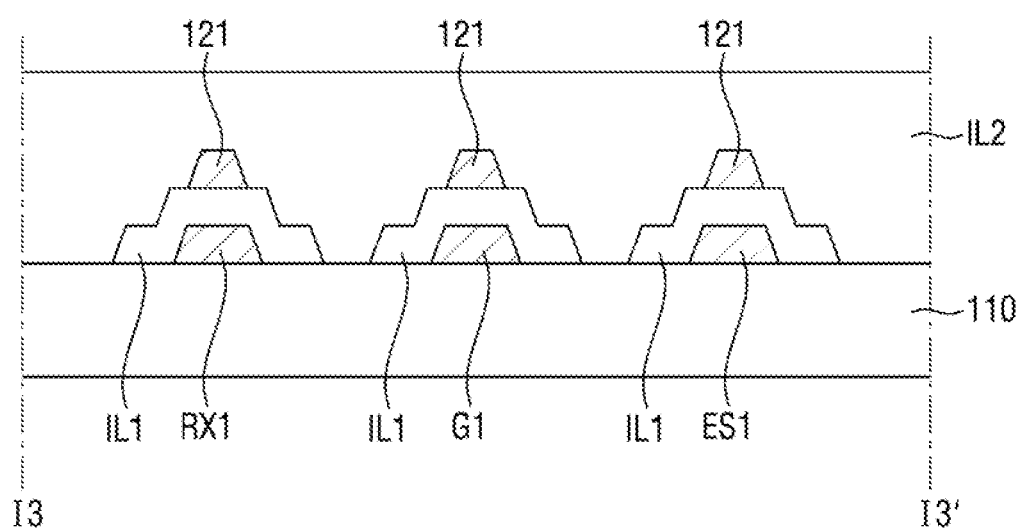
FIG. 10 is a cross-sectional view of a touch member of an OLED display device according to an exemplary embodiment of the present invention.

FIG. 10 is a cross-sectional view of a touch member of an OLED display device according to an exemplary embodiment of the present invention. FIG. 10 shows a modified example of FIG. 7.

Referring to FIG. 10, a touch member 50-1 differs from the touch member 50 of FIG. 7 in that dummy lines 121 are further provided on insulating patterns IL1. The dummy lines 121 are illustrated as overlapping with a first sensing line RX1, a first guard line G1, and a first ground line ES1 (e.g., along the third direction D3), but the present invention is not limited thereto. For example, the dummy lines 121 may be formed to overlap with all lines formed in an inactive area NAA, e.g., touch signal lines (TX1-1 through TX4-1, TX1-2 through TX4-2, and RX1 through RX8), ground lines (ES1 and ES2), and guard lines (G1 through G4).

The dummy lines 121 may be disposed on an upper insulating layer IL2 to be isolated from one another and to overlap with the first sensing line RX1, the first guard line G1, and the first ground line ES1. The dummy lines 121 may be disposed in the same layer as the first sensing line RX1, the first guard line G1, and the first ground line ES1 (e.g., in a detection electrode layer 120) and may be patterned together with the first sensing line RX1, the first guard line G1, and the first ground line ES1. The dummy lines 121 may be formed of the same material as detection electrodes (E1 and E2) and island electrodes (IS1 and IS2).

In a case where the dummy lines 121 are disposed to overlap with the first sensing line RX1, the first guard line G1, and the first ground line ES1, an etchant can be prevented from infiltrating into the first sensing line RX1, the first guard line G1, and the first ground line ES1 during the etching of the insulating patterns IL1.

The upper insulating layer IL2 may be disposed on the dummy lines 121.

Figure 11:
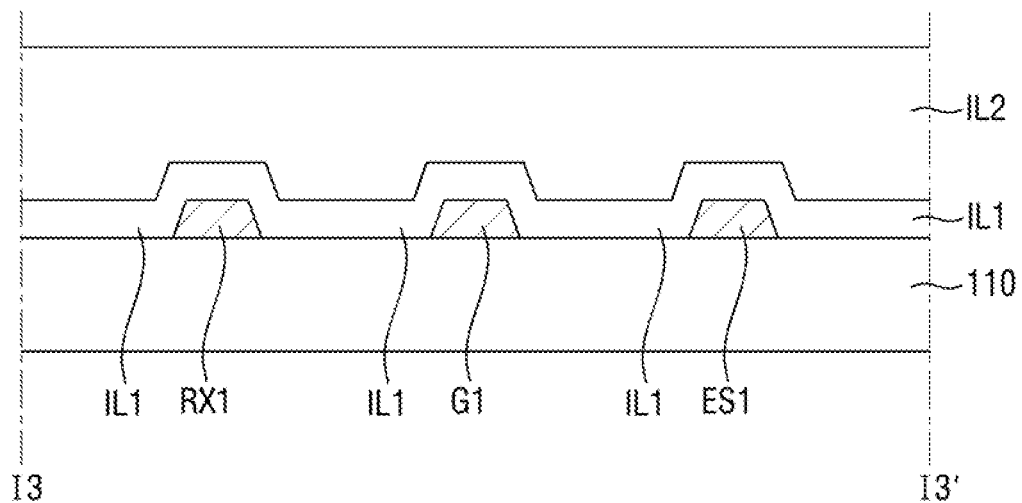
FIG. 11 is a cross-sectional view of a touch member of an OLED display device according to an exemplary embodiment of the present invention.

FIG. 11 is a cross-sectional view of a touch member of an OLED display device according to an exemplary embodiment of the present invention. FIG. 11 shows a modified example of FIG. 7.

Referring to FIG. 11, a touch member 50-2 differs from the touch member 50 of FIG. 7 in that insulating patterns IL1 are formed on substantially the entire surface of an inactive area NAA. The insulating patterns IL1 of the touch member 50-2 may be formed in one integral body, whereas the insulating patterns IL1 of FIG. 3 are formed in the inactive area NAA to be separate from one another. For example, the insulating patterns IL1 of the touch member 50-2 may be directly physically connected to one another, rather than being isolated from one another to cover ground lines (ES1 and ES2), guard lines (G1 through G4), and touch signal lines (TX1-1 through TX4-1, TX1-2 through TX4-2, and RX1 through RX8).

Figure 12:
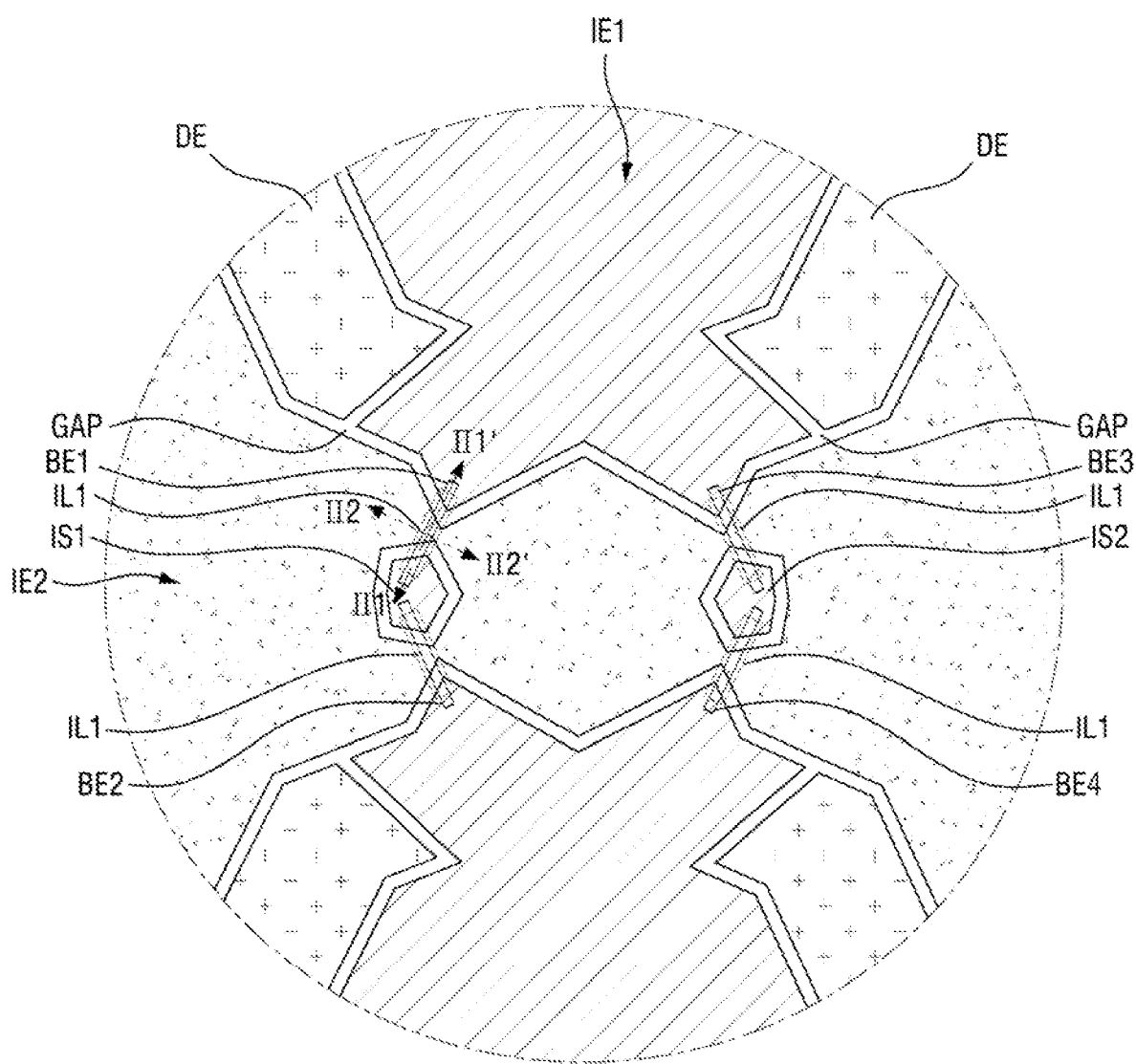
FIG. 12 is a partial enlarged layout view of a touch member of an OLED display device according to an exemplary embodiment of the present invention.
Figure 13:
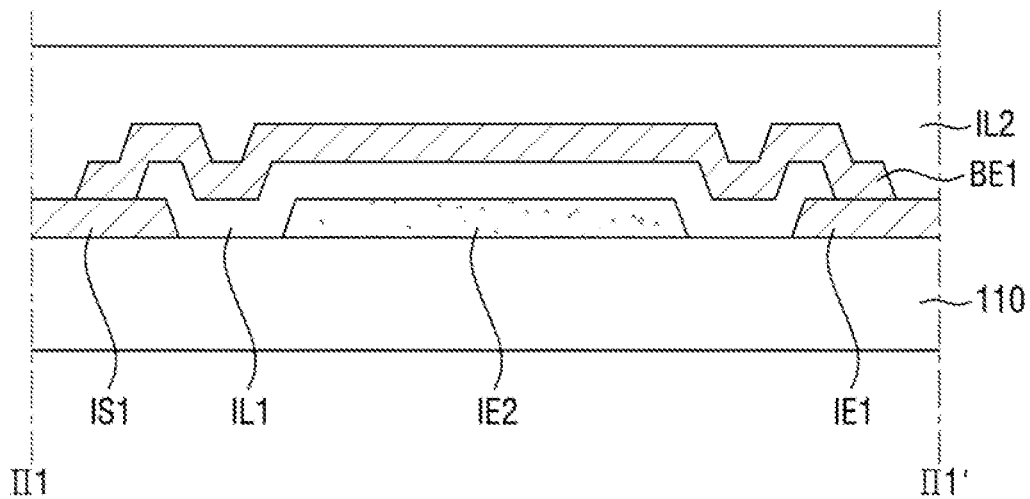
FIG. 13 is a cross-sectional view, taken along line II1-II1' of FIG. 12, of the OLED display device of FIG. 12.
Figure 14:
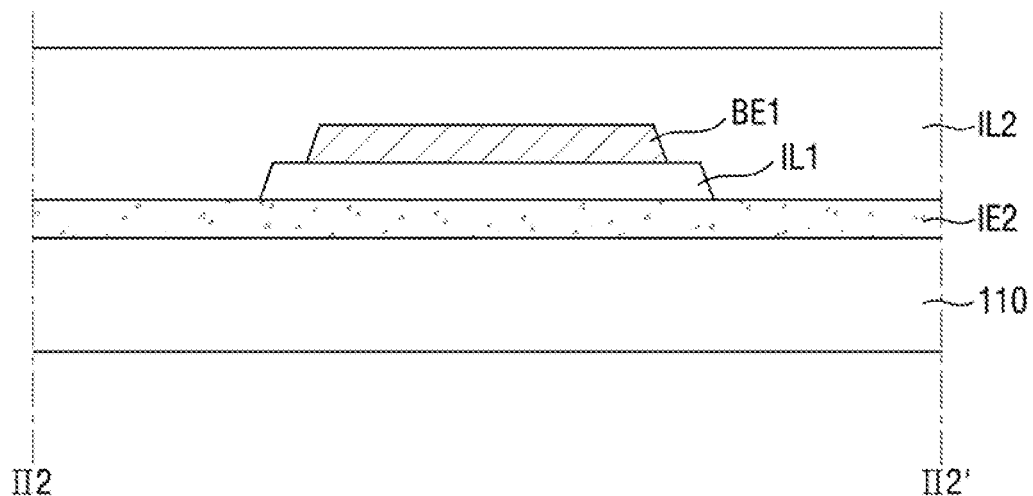
FIG. 14 is a cross-sectional view, taken along line II2-II2' of FIG. 12, of the OLED display device of FIG. 13.
Figure 15:
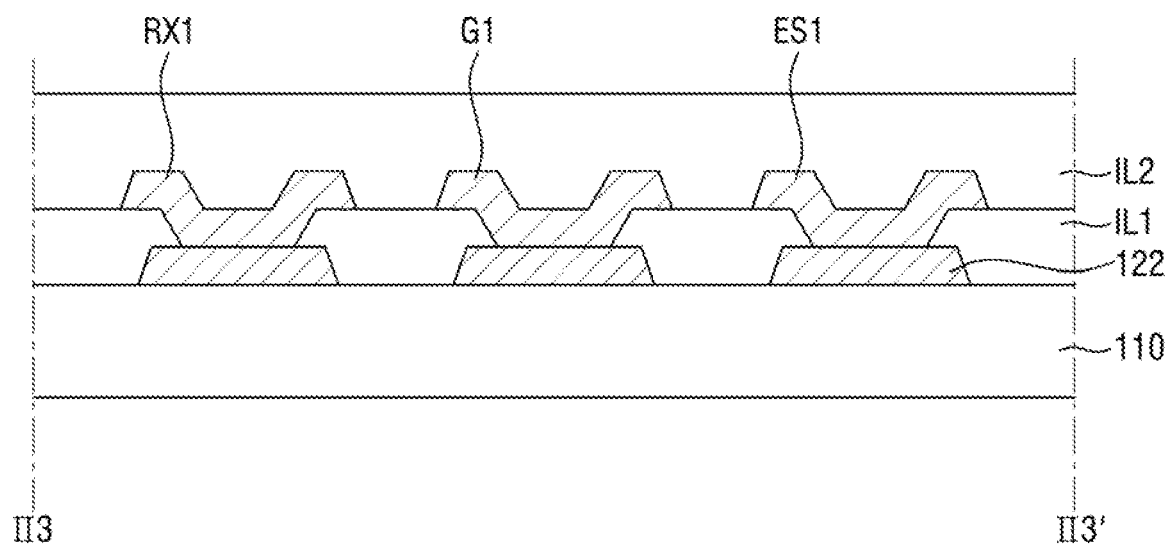
FIG. 15 is a cross-sectional view showing an inactive area of a modified example of FIG. 7.

FIG. 12 is a partial enlarged layout view of a touch member of an OLED display device according to an exemplary embodiment of the present invention. FIG. 13 is a cross-sectional view, taken along line II1-II1' of FIG. 12, of the OLED display device of FIG. 12. FIG. 14 is a cross-sectional view, taken along line II2-II2' of FIG. 12, of the OLED display device of FIG. 13. FIG. 15 is a cross-sectional view showing an inactive area of a modified example of FIG. 7. FIG. 15 is a cross-sectional view taken along line II3-II3' of FIG. 12, and FIG. 12 shows a modified example of FIG. 4.

Referring to FIGS. 12 through 15, a touch member 50-3 differs from the touch member 50 of FIGS. 4 through 7 in that a first bridge electrode BE1 is disposed on a detection electrode layer 120.

The stack structure of the touch member 50-3 in an active area AA will be described in more detail below.

The detection electrode layer 120 may be disposed on a base 110. The detection electrode layer 120 may include a first detection electrode IE1, a second detection electrode IE2, and a first island electrode IS1. The first detection electrode IE1, the second detection electrode IE2, and the first island electrode IS1 may be physically isolated from one another by gaps.

The first bridge electrode BE1 may be disposed on an insulating pattern IL1. The first bridge electrode BE1 may extend even to regions where the insulating pattern IL1 is not formed. The first bridge electrode BE1 may be in direct contact with the first island electrode IS1 and the first detection electrode IE1. Accordingly, the first island electrode IS1 and the first detection electrode IE1 may be electrically connected to each other.

An upper insulating layer IL2 may be disposed on the first bridge electrode BE1.

The stack structure of the touch member 50-3 in an inactive area NAA will be described in more detail below.

A plurality of electrode patterns 122 may be disposed on the base 110. The electrode patterns 122 may be isolated from one another. The electrode patterns 122 may be disposed in the same layer as the detection electrode layer 120 and may be formed of the same material as the detection electrode layer 120.

Insulating patterns IL1 may be disposed on the electrode patterns 122. The insulating patterns IL1 may include openings, which expose parts of the electrode patterns 122.

A wiring layer may be disposed on the insulating patterns IL1. The wiring layer may include touch signal lines (TX1-1 through TX4-1, TX1-2 through TX4-2, and RX1 through RX8), guard lines (G1 through G4), and ground lines (ES1 and ES2). The touch signal lines (TX1-1 through TX4-1, TX1-2 through TX4-2, and RX1 through RX8) may be formed to overlap with the electrode patterns 122 (e.g., along the third direction D3) and may be in direct contact with the electrode patterns 122 through the openings of the insulating patterns IL1.

By minimizing the area occupied by the insulating patterns IL1 in a non-display area NDA, panel warpage can be reduced or eliminated. Also, since the electrode patterns 122 are disposed to be in direct contact with the touch signal lines (TX1-1 through TX4-1, TX1-2 through TX4-2, and RX1 through RX8), the guard lines (G1 through G4), and the ground lines (ES1 and ES2), the electrode patterns 122 can serve as wiring.

An upper insulating layer IL2 may be disposed on the wiring layer.

Figure 16:
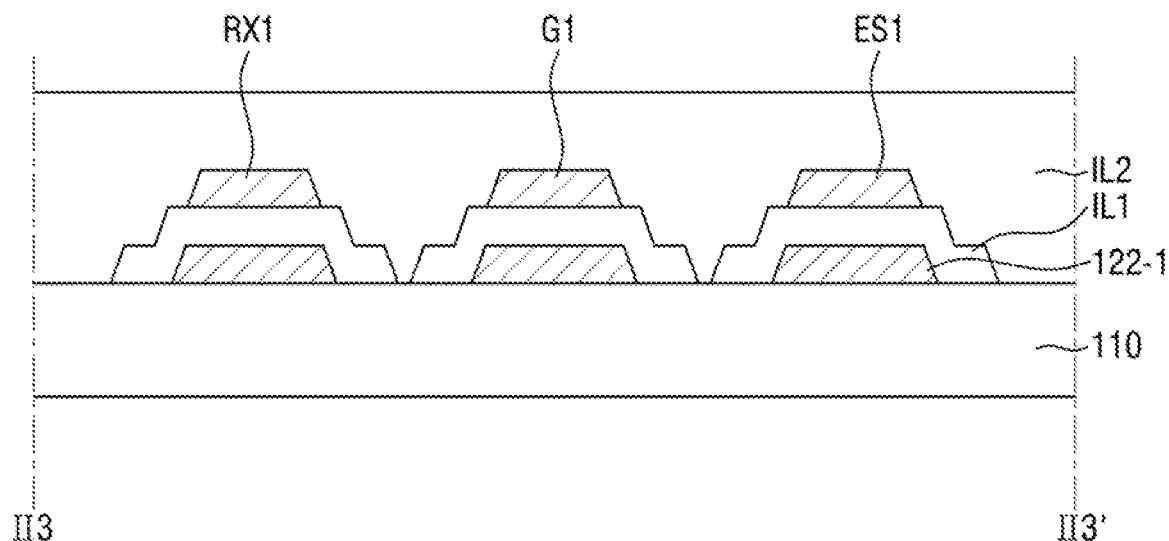
FIG. 16 is a cross-sectional view showing an inactive area of a modified example of FIG. 15.

FIG. 16 is a cross-sectional view showing an inactive area of a modified example of FIG. 15.

Referring to FIG. 16, a touch member 50-3-1 differs from the touch member 50-3 in that electrode patterns 122-1 are not in direct contact with touch signal lines (TX1-1 through TX4-1, TX1-2 through TX4-2, and RX1 through RX8), guard lines (G1 through G4), and ground lines (ES1 and ES2).

The electrode patterns 122-1 may be dummy electrodes.

Insulating patterns IL1 may be disposed between, and overlap with (e.g., along the third direction D3), the electrode patterns 122-1 and a wiring layer (e.g., a layer of a first touch sensing line RX1, a first guard line G1, and a first ground line ES1) and may be formed to be isolated from one another.

Figure 17:
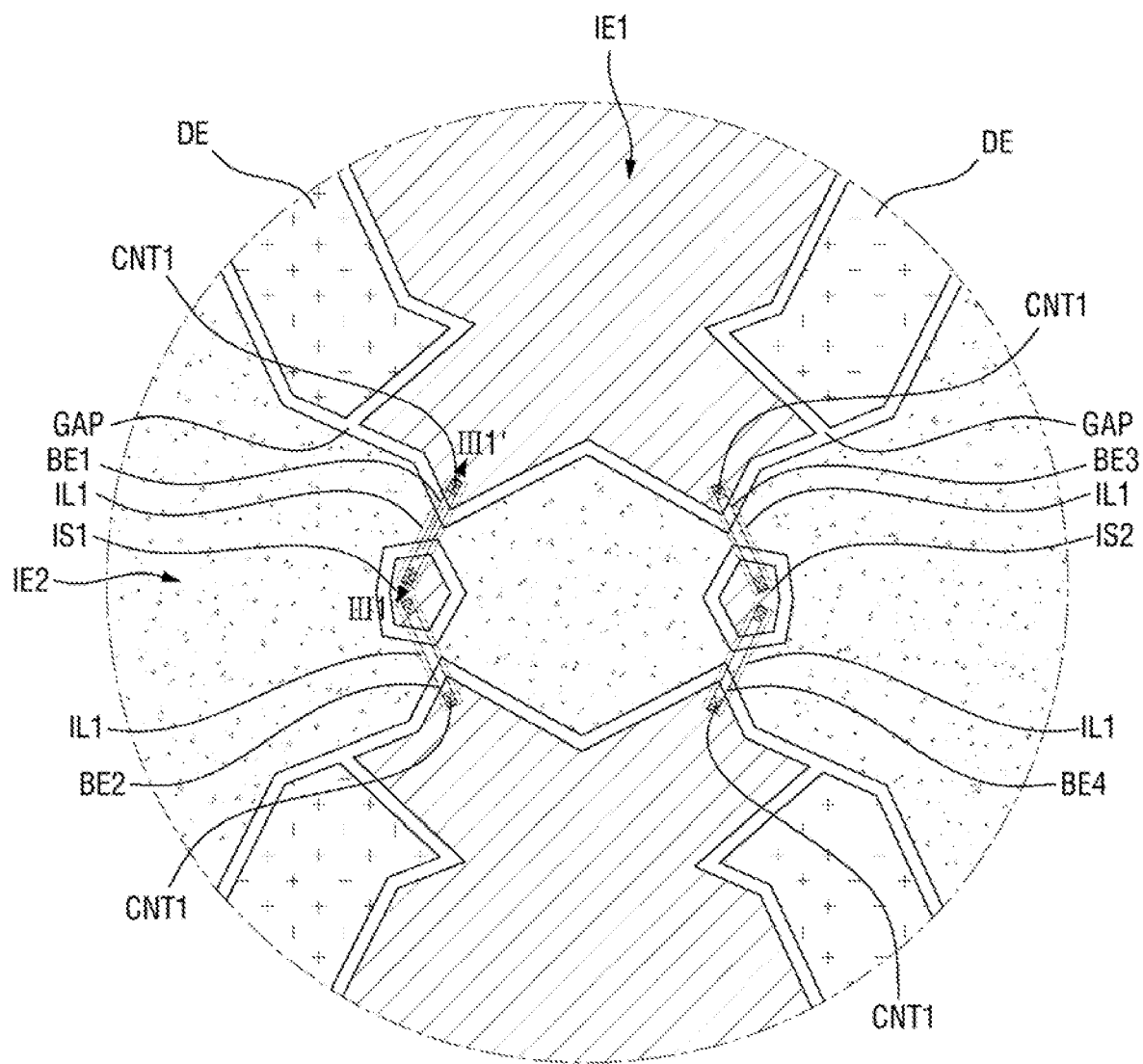
FIG. 17 is a partial enlarged layout view of a touch member of an OLED display device according to an exemplary embodiment of the present invention.
Figure 18:
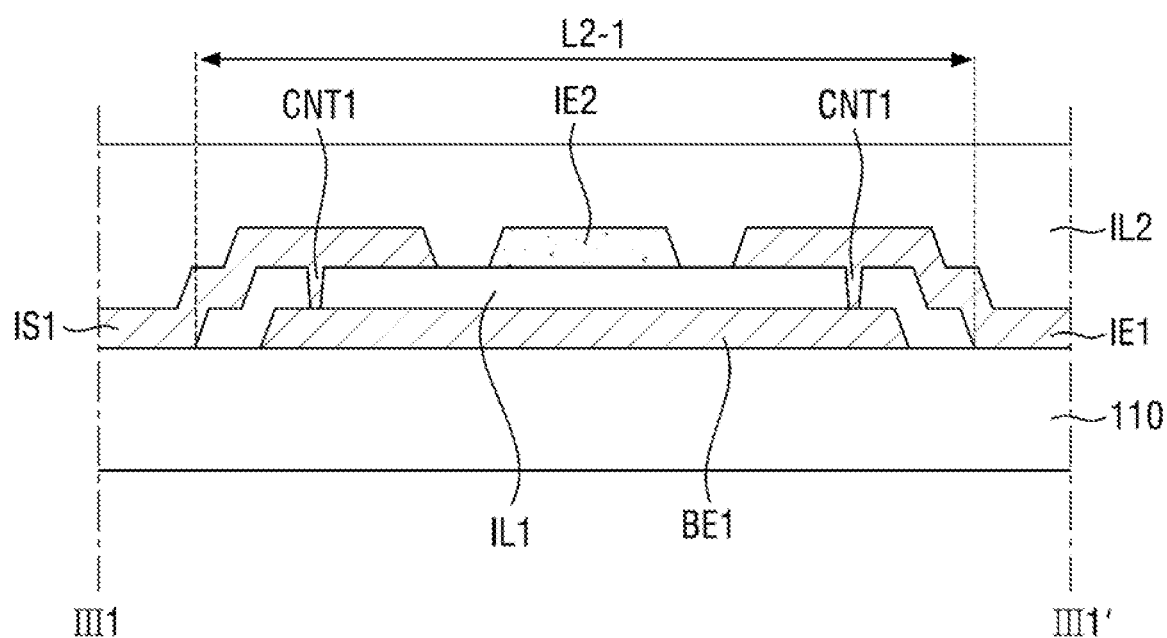
FIG. 18 is a cross-sectional view, taken along line III1-III1' of FIG. 17, of the OLED display device of FIG. 17.

FIG. 17 is a partial enlarged layout view of a touch member of an OLED display device according to an exemplary embodiment of the present invention. FIG. 18 is a cross-sectional view, taken along line III1-III1' of FIG. 17, of the touch member of FIG. 17. FIG. 17 shows a modified example of FIG. 4.

Referring to FIGS. 17 and 18, a touch member 50-4 differs from the touch member 50 of FIG. 4 in that a first bridge electrode BE1 is in direct contact with a first island electrode IS1 and a first detection electrode IE1 not directly, but through contact holes CNT1 formed in an insulating pattern IL1.

The first bridge electrode BE1 may be disposed on a base 110.

In the touch member 50 of FIG. 4, an insulating pattern IL1 may be formed to expose both end portions of the first bridge electrode BE1. In the touch member 50-4, an insulating pattern IL1 may be formed on the first bridge electrode BE1 to substantially cover the entire first bridge electrode BE1 and may include contact holes CNT1, which expose parts of the first bridge electrode BE1. Here, a long side L2-1 of the insulating pattern IL1 of FIG. 18 may have a length of from about 150 μm to about 180 μm.

A first island electrode IS1, a first detection electrode IE1, and a second detection electrode IE2 may be disposed on the insulating pattern IL1. The first island electrode IS1, the first detection electrode IE1, and the second detection electrode IE2 may be disposed on the insulating pattern IL1 to be isolated and insulated from one another. The first island electrode IS1 and the first detection electrode IE1 may be in direct contact with the first bridge electrode BE1 through the contact holes CNT1 of the insulating pattern IL1. The first island electrode IS1 and the first detection electrode IE1 may be electrically connected to each other via the first bridge electrode BE1.

An upper insulating layer IL2 may be disposed on the first island electrode IS1, the first detection electrode IE1, and the second detection electrode IE2.

Figure 19:
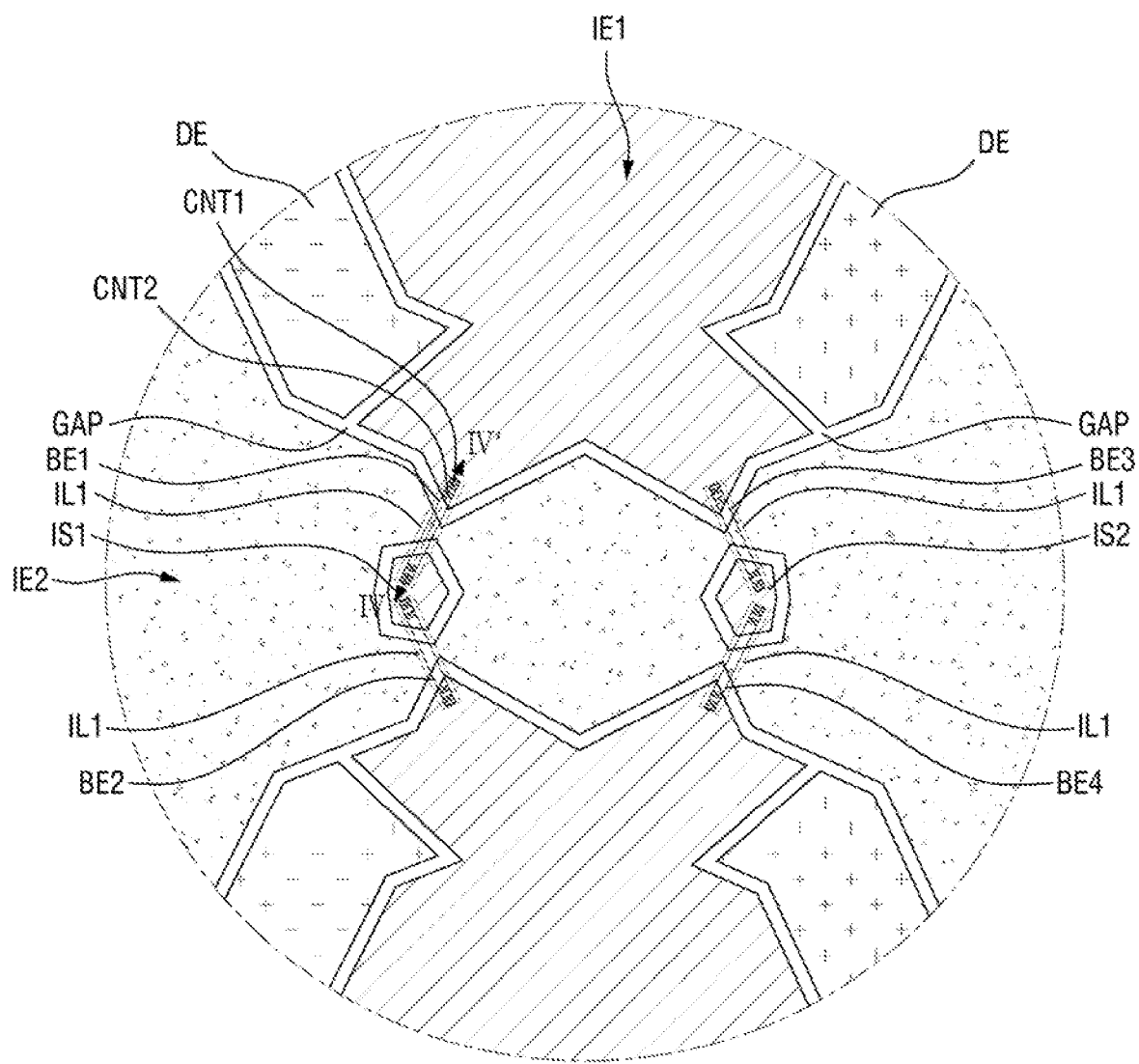
FIG. 19 is a partial enlarged layout view of a touch member of an OLED display device according to an exemplary embodiment of the present invention.
Figure 20:
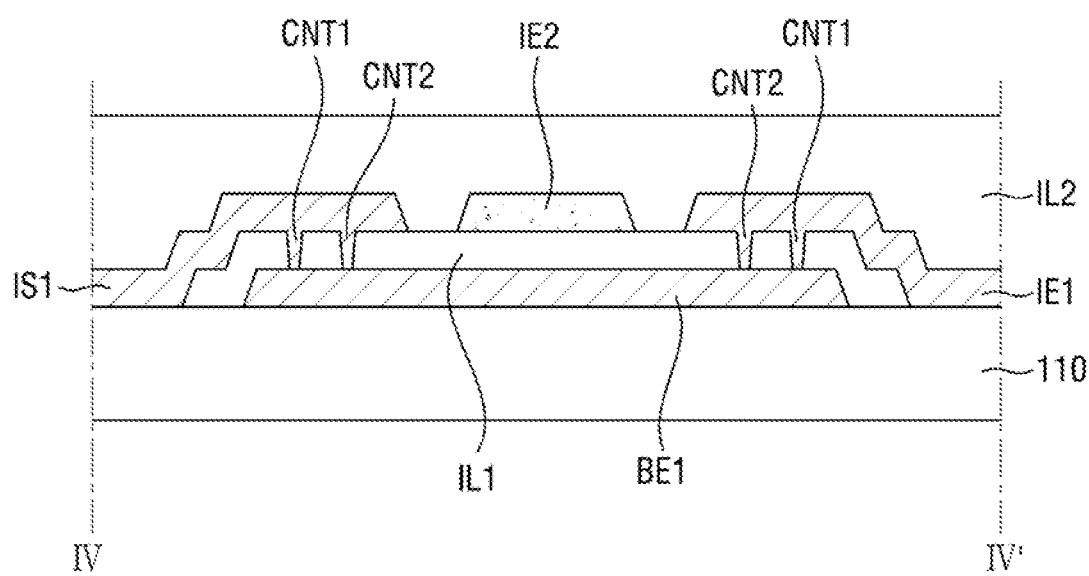
FIG. 20 is a cross-sectional view, taken along line IV1-IV1' of FIG. 17, of the touch member of FIG. 19.

FIG. 19 is a partial enlarged layout view of a touch member of an OLED display device according to an exemplary embodiment of the present invention. FIG. 20 is a cross-sectional view, taken along line IV1-IV1' of FIG. 17, of the touch member of FIG. 19. FIG. 19 shows a modified example of FIG. 4.

Referring to FIGS. 19 and 20, a touch member 50-5 differs from the touch member 50-4 of FIGS. 17 and 18 in that each of a first island electrode IS1 and a first detection electrode IE1 is connected to a first bridge electrode BE1 through two contact holes (CNT1 and CNT2).

The first bridge electrode BE1 may be disposed on a base 110.

An insulating pattern IL1 may be formed on the first bridge electrode BE1 to substantially cover the entire first bridge electrode BE1 and may include a plurality of contact holes (CNT1 and CNT2), which expose parts of the first bridge electrode BE1. The insulating pattern IL1 may include two contact holes (CNT1 and CNT2) for connecting the first detection electrode IE1 and the first bridge electrode BE1 and two contact holes (CNT1 and CNT2) for connecting the first island electrode IS1 and the first bridge electrode BE1. However, the number of contact holes for connecting the first detection electrode IE1 and the first bridge electrode BE1 and the number of contact holes for connecting the first island electrode IS1 and the first bridge electrode BE1 are not particularly limited. For example, the insulating pattern IL1 may include two or more contact holes for connecting the first detection electrode IE1 and the first bridge electrode BE1 and two or more contact holes for connecting the first island electrode IS1 and the first bridge electrode BE1. A long side of the insulating pattern IL1 may have a length of from about 150 μm to 180 μm.

The first island electrode IS1, the first detection electrode IE1, and the second detection electrode IE2 may be disposed on the insulating pattern IL1. The first island electrode IS1, the first detection electrode IE1, and the second detection electrode IE2 may be disposed on the insulating pattern IL1 to be isolated and insulated from one another. Each of the first island electrode IS1 and the first detection electrode IE1 may be in contact with the first bridge electrode BE1 through two contact holes (CNT1 and CNT2).

In a case where each of the first island electrode IS1 and the first detection electrode IE1 are in direct contact with the first bridge electrode BE1 through two contact holes, the first island electrode IS1 and the first detection electrode IE1 can remain electrically connected to the first bridge electrode BE1 through one of the two contact holes even if they are disconnected from the first bridge electrode BE1 through the other contact hole.

Figure 21:
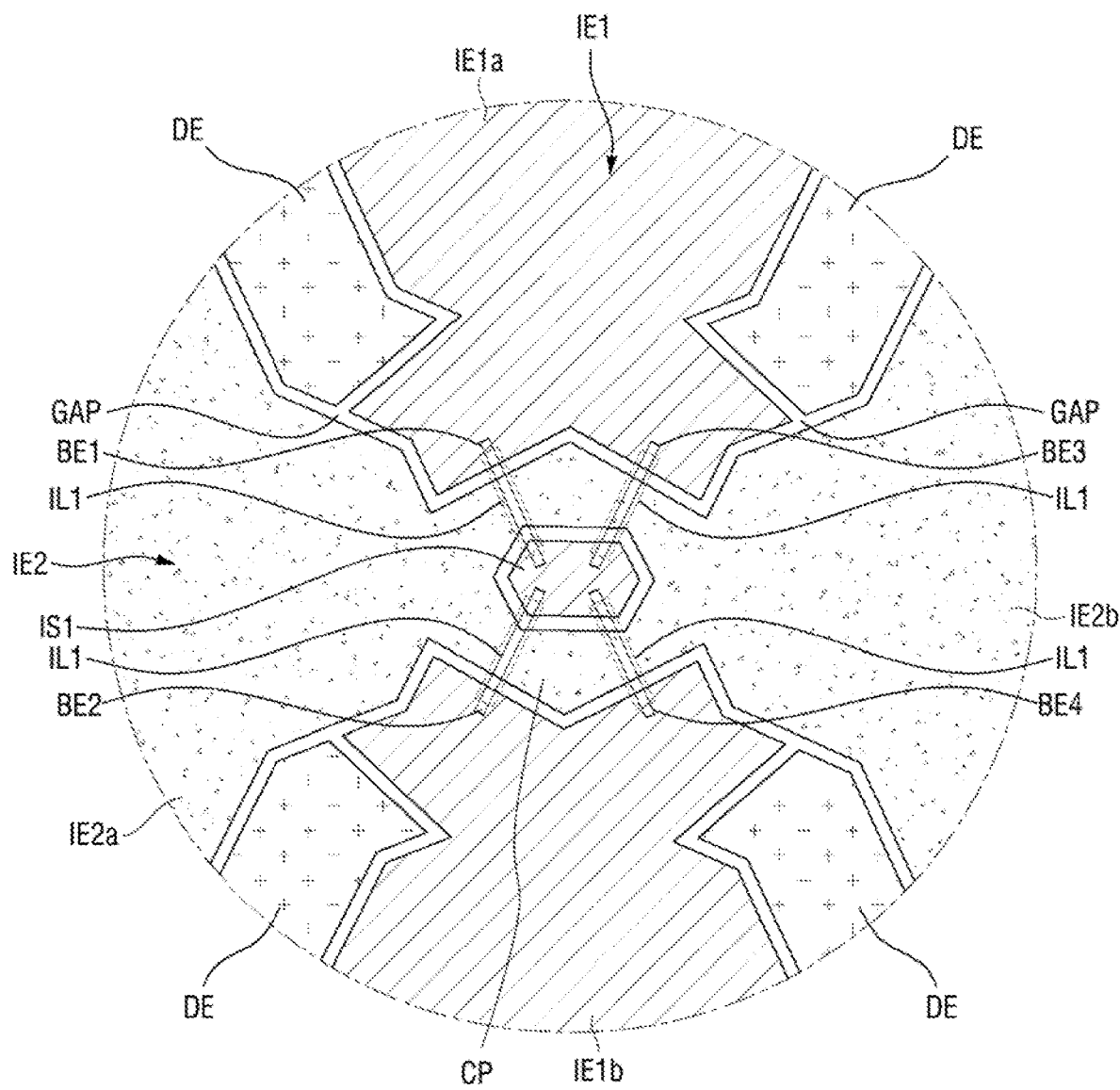
FIG. 21 is a partial enlarged layout view of a touch member of an OLED display device according to an exemplary embodiment of the present invention.

FIG. 21 is a partial enlarged layout view of a touch member of an OLED display device according to an exemplary embodiment of the present invention. FIG. 21 shows a modified example of FIG. 4.

Referring to FIG. 21, a touch member differs from the touch member 50 of FIG. 4 in that a single island electrode, e.g., a first island electrode IS1, is provided between a pair of adjacent sub-detection electrodes of a first detection electrode IE1, e.g., first and second sub-detection electrodes IE1a and IE1b.

The touch member of FIG. 21 may include the first island electrode IS1 between the first and second sub-detection electrodes IE1a and IE1b of the first detection electrode IE1, which are adjacent to each other. The first island electrode IS1 may be disposed in a second detection electrode IE2. As an example, the first island electrode IS1 may be disposed in a connecting portion CP of the second detection electrode IE2 and may be formed to be insulated from the second detection electrode IE2 by a gap.

The first island electrode IS1 may have a hexagonal shape, but the shape of the first island electrode IS1 is not particularly limited. For example, the first island electrode IS1 may have various other shapes such as a square shape, a polygonal shape other than a hexagonal or square shape, a circular shape, or an elliptical shape.

The first sub-detection electrode IE1a of the first detection electrode IE1 may be electrically connected to the first island electrode IS1 via two bridge electrodes, e.g., first and third bridge electrodes BE1 and BE3. As an example, the first and third bridge electrodes BE1 and BE3 may be disposed between the first sub-detection electrode IE1a of the first detection electrode IE1 and the first island electrode IS1. Also, second and fourth bridge electrodes BE2 and BE4 may be disposed between the second sub-detection electrode IE1b of the first detection electrode IE1 and the first island electrode IS1.

The first and second sub-detection electrodes IE1a and IE1b of the first detection electrode IE1 may be electrically connected to each other via the first through fourth bridge electrodes BE1 through BE4 and the first island electrode IS1. Since each of the first and second sub-detection electrodes IE1a and IE1b of the first detection electrode IE1 is connected to the first island electrode IS1 via two bridge electrodes, the first and second sub-detection electrodes IE1a and IE1b of the first detection electrode IE1 can remain electrically connected even if one of the first through fourth bridge electrodes BE1 through BE4 is disconnected.

Figure 22:
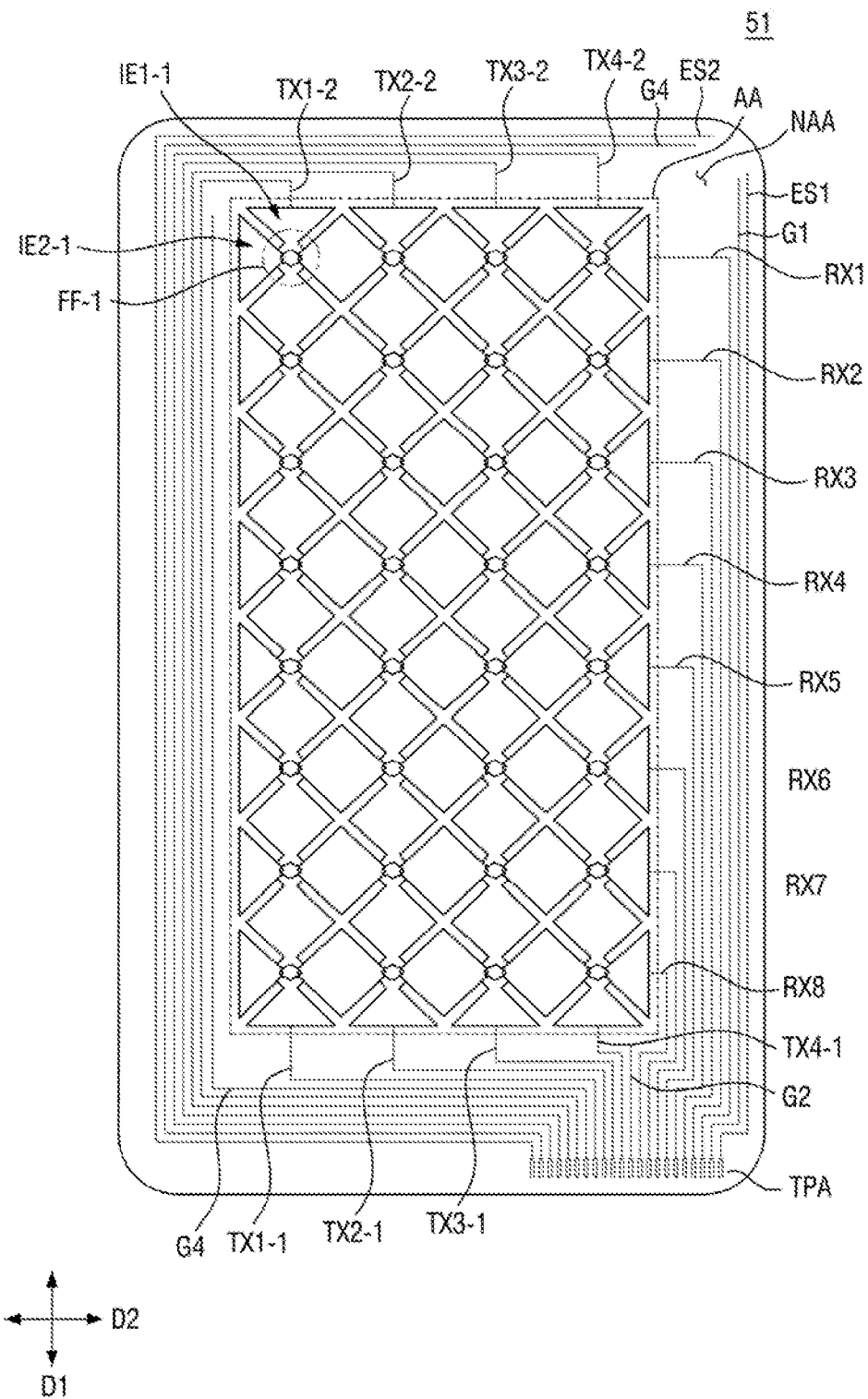
FIG. 22 is a layout view of a touch member of an OLED) display device according to an exemplary embodiment of the present invention.
Figure 23:
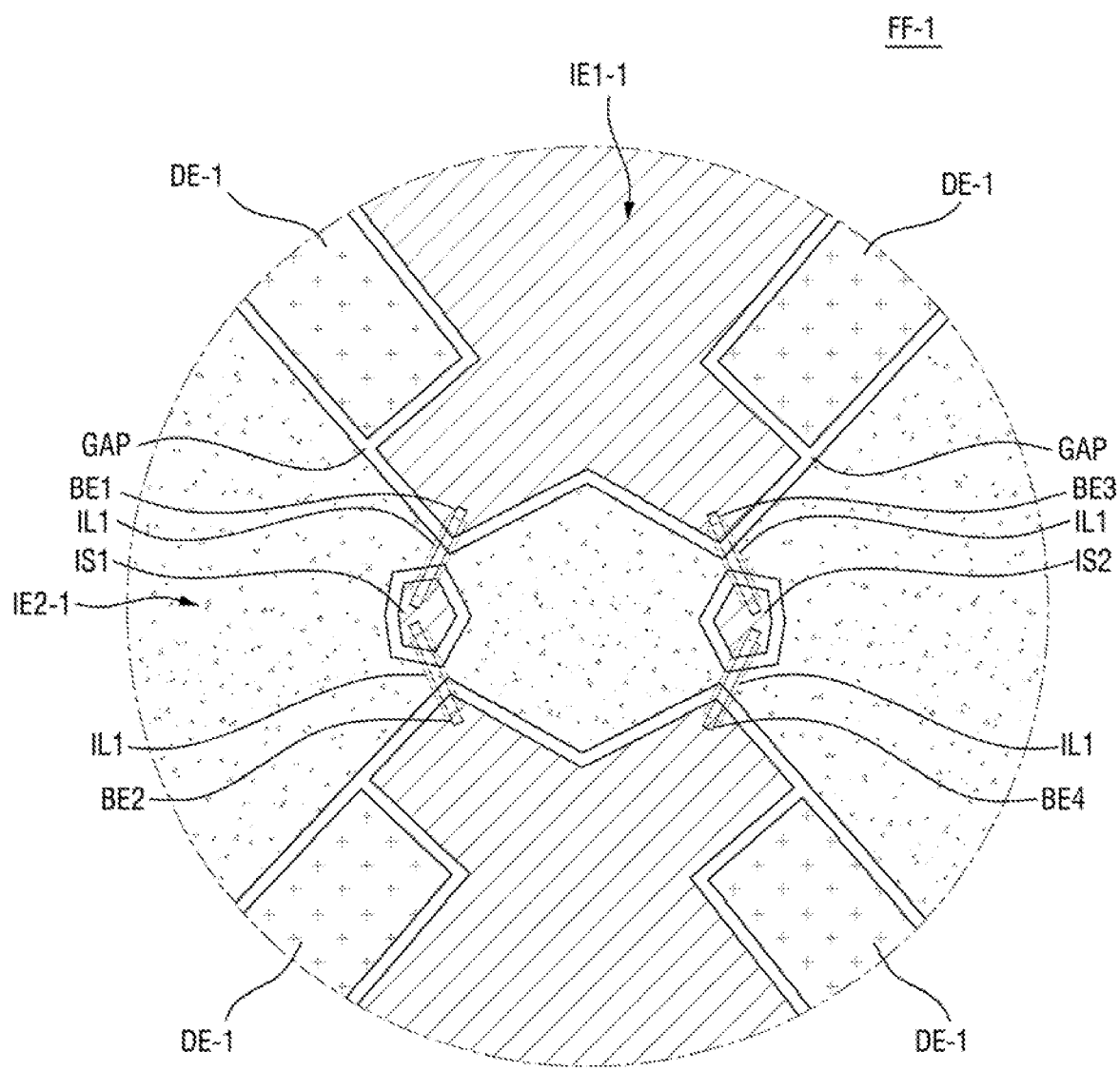
FIG. 23 is an enlarged view of an area FF-1 of FIG. 22.

FIG. 22 is a layout view of a touch member of an OLED display device according to another exemplary embodiment of the present invention. FIG. 23 is an enlarged view of an area FF-1 of FIG. 22. FIG. 22 shows a modified example of FIG. 3.

Referring to FIGS. 22 and 23, a touch member 51 differs from the touch member 50 of FIGS. 3 and 4 in that sub-detection electrodes of each first detection electrode IE1-1 and sub-detection electrodes of each second detection electrode IE2-1 include rectilinear sides.

As an example, referring to FIG. 22, the sub-detection electrodes of each first detection electrode IE1-1 or each second detection electrode IE2-1 may have a rhombus shape. Particularly, sub-detection electrodes formed in the middle of each first detection electrode IE1-1 may have a rhombus shape with rectilinear sides.

As an example, sub-detection electrodes formed on both ends of each first detection electrode IE1-1 may have a shape obtained by cutting the shape of the sub-detection electrodes formed in the middle of each first detection electrode IE1-1 in halves. For example, the sub-detection electrodes formed on both ends of each first detection electrode IE1-1 may substantially have the shape of an equilateral triangle obtained by cutting a rhombus along the horizontal diagonal, such that the two equal sides and the base of the equilateral triangle may all be in a rectilinear shape. The sub-detection electrodes formed on both ends of each first detection electrode IE1-1 may be in direct physical contact with touch driving lines (TX1-1 through TX4-1 and TX1-2 through TX4-2).

Similarly, each second detection electrode IE2-1 may include sub-detection electrodes having a rhombus shape with rectilinear sides and sub-detection electrodes having an equilateral triangular shape with rectilinear sides. The equilateral triangular sub-detection electrodes of each second detection electrode IE2-1 may be in direct physical contact with sensing lines (RX1 through RX8).

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A touch member, comprising:
   a base;
   a first touch electrode including a plurality of first sub-detection electrode patterns arranged on the base in a first direction;
   a second touch electrode including a plurality of second sub-detection electrodes arranged on the base in a second direction, which intersects the first direction, and an electrode pattern connecting portion electrically connecting adjacent second sub-detection electrode patterns;
   an island electrode pattern disposed in the second touch electrode and isolated front the first touch electrode; and
   a bridge pattern electrically connecting a first sub-detection electrode of the first sub-detection electrode patterns to the island electrode pattern, the bridge pattern having a top surface that contact insulating pattern and second conductive layer, a bottom surface that contacts the base, and two opposite side surfaces that each contact the second conductive layer, wherein
   the bridge pattern is formed of a first conductive layer,
   the first sub-detection electrode patterns, the electrode pattern connecting portion, the second sub-detection electrode patterns, and the island electrode pattern are formed of the second conductive layer, and
   the insulating pattern is disposed between the bridge pattern and a part of the second conductive layer overlapping with the bridge pattern, wherein the insulating pattern is narrower than the bridge pattern such that the two opposite side surfaces of the bridge pattern are uncovered by the insulating pattern.

2. The touch member of claim 1, wherein the bridge pattern and a part of the insulating pattern overlapping with the bridge pattern extend in a third direction different from the first and second directions.

3. The touch member of claim 2, wherein a length, in the third direction, of the bridge pattern is greater than a length, in the third direction, of the part of the insulating pattern overlapping with the bridge pattern.

4. The touch member of claim 3, wherein the length, in the third direction, of the part of the insulating pattern overlapping with the bridge pattern is 180 μm or less.

5. The touch member of claim 3, wherein a width, in a fourth direction, which intersects the third direction, of the bridge pattern is smaller than a width, in the fourth direction, of the part of the insulating pattern overlapping with the bridge pattern.

6. The touch member of claim 5, wherein the width, in the fourth direction, of the part of the insulating pattern overlapping with the bridge pattern is about 12 μm to about 18 μm.

7. The touch member of claim 5, wherein a difference between the width, in the fourth direction, of the part of the insulating pattern overlapping with the bridge pattern and the width, in the fourth direction, of the bridge pattern is 10 μm or less.

8. The touch member of claim 1, wherein the bridge pattern includes a first bridge pattern electrically connecting the island electrode pattern to a first sub-detection electrode pattern adjacent to a first side, in the first direction, of the first touch electrode and a second bridge pattern electrically connecting the island electrode pattern to a first sub-detection electrode pattern adjacent to a second side, in the first direction, of the first touch electrode.

9. The touch member of claim 1, wherein the island electrode pattern includes a first island electrode pattern disposed on a first side, in the second direction, of an intersection between the first and second touch electrodes and a second island electrode pattern disposed on a second side, in the second direction, of the intersection between the first and second touch electrodes.

10. The touch member of claim 9, wherein the bridge pattern includes a first bridge pattern electrically connecting the first island electrode pattern to a first sub-detection electrode pattern adjacent to a first side, in the first direction, of the first touch electrode, a second bridge pattern electrically connecting the first island electrode pattern to a first sub-detection electrode pattern adjacent to a second side, in the first direction, of the first touch electrode, a third bridge pattern electrically connecting the second island electrode pattern to the first sub-detection electrode pattern adjacent to the first side, in the first direction, of the first touch electrode, and a fourth bridge pattern electrically connecting the second island electrode pattern to the first sub-detection electrode pattern adjacent to the second side, in the first direction, of the first touch electrode.

11. The touch member of claim 1, wherein
   the touch member includes an active area and an inactive area, and
   the first conductive layer includes signal lines disposed in the inactive area.

12. The touch member of claim 11, wherein the signal lines include a first signal line connected to the first side of the first touch electrode, a second signal line connected to the second side of the first touch electrode, and a third signal line connected to the second touch electrode.

13. The touch member of claim 12, further comprising:
third sub-detection electrode patterns disposed between the first sub-detection electrode patterns and the second sub-detection electrode patterns adjacent to the first sub-detection electrode patterns,
wherein the third sub-detection electrode patterns are unconnected with the first, second, and third signal lines.

14. The touch member of claim 12, wherein
insulating patterns are disposed on the first, second, and third signal lines, and
an area occupied by the insulating patterns in the inactive area is smaller than an area of the inactive area.

15. The touch member of claim 14, wherein the insulating patterns are disposed to overlap with the first, second, and third signal lines and to be isolated from one another.

16. The touch member of claim 12, wherein
the signal lines further include a fourth signal line disposed on the outside of the first and second signal lines and a fifth signal line disposed on the outside of the third signal line, and
the fourth and fifth signal lines are not connected to each other.

17. The touch member of claim 16, wherein the fourth and fifth signal lines are unconnected with the first and second touch electrodes.

18. The touch member of claim 1, wherein
the second conductive layer is disposed on the insulating pattern, and
the insulating pattern is disposed on the first conductive layer.

19. The touch member of claim 18, wherein the bridge pattern is in direct contact with the first sub-detection electrode patterns and the island electrode pattern.

20. The touch member of claim 18, wherein
the insulating pattern includes a contact hole, which exposes the bridge pattern, and
the first sub-detection electrode patterns are in direct contact with the bridge pattern through the contact hole.

21. The touch member of claim 1, further comprising:
a base on which the first conductive layer, the second conductive layer, and the insulating pattern are formed.

22. The touch member of claim 21, wherein an area of the insulating pattern is 2% or less of an area of the base.

23. The touch member of claim 1, wherein each of the first sub-detection electrode patterns includes sides in a zigzag shape.

24. The touch member of claim 1, wherein the first sub-detection electrode patterns, the second sub-detection electrode patterns, and the island electrode pattern are isolated from one another by gaps.

25. A display device comprising:
a substrate;
a driving circuit layer disposed on the substrate and including a plurality of thin-film transistors;
a light-emitting element layer disposed on the driving circuit layer and including a plurality of pixel electrodes, which are connected to the thin-film transistors;
an encapsulation film disposed on the light-emitting element layer;
a touch input sensing layer disposed on the encapsulation film; and
a cover layer disposed on the touch input sensing layer, wherein
the touch input sensing layer includes a first conductive layer, an insulating pattern disposed on the first conductive layer, and a second conductive layer disposed on the insulating pattern,
the second conductive layer includes a first touch electrode including a plurality of first sub-detection electrode patterns arranged in a first direction, a second touch electrode including a plurality of second sub-detection electrodes arranged in a second direction, which intersects the first direction, and an electrode pattern connecting portion electrically connecting adjacent second sub-detection electrode patterns, and an island electrode pattern disposed in the second touch electrode and isolated from the first touch electrode,
the first conductive layer includes a bridge pattern electrically connecting first sub-detection electrode patterns adjacent to the island electrode pattern, and
the insulating pattern is narrower than the bridge pattern such that two opposite side surfaces of the bridge pattern are uncovered by the insulating pattern and each of the two opposite side surfaces of the bridge pattern that are uncovered by the insulating pattern contact the second conductive layer.

26. The display device of claim 25, wherein an area of the insulating pattern is 2% or less of an area of the substrate.

27. The display device of claim 25, wherein the touch input sensing layer further includes an upper insulating layer disposed on the second conductive layer.

28. A touch member, comprising:
a first touch electrode including a plurality of first sub-detection electrode patterns spaced apart from each other;
a second touch electrode including a plurality of second sub-detection electrodes spaced apart from each other, wherein the second sub-detection electrodes are spaced apart from the first touch electrode patterns;
an electrode pattern connecting portion electrically connecting adjacent second sub-detection electrode patterns to each other;
an island electrode pattern disposed in the second touch electrode and spaced apart from the first touch electrode;
a bridge electrode electrically connecting a first sub-detection electrode of the first sub-detection electrode patterns to the island electrode pattern; and
an insulating pattern disposed between the bridge electrode and a portion of the first island electrode,
wherein the insulating pattern is narrower than the bridge electrode such that two opposite side surfaces of the bridge electrode are uncovered by the insulating pattern and each of the two opposite side surfaces of the bridge electrode that are uncovered by the insulating pattern contact the island electrode pattern and the plurality of first sub-detection electrode patterns, respectively.

29. The touch member of claim 1, wherein the two opposite side surfaces of the bridge pattern that are uncovered by the insulating pattern contact the island electrode pattern and the first sub-detection electrode, respectively.

30. The display device of claim 25, wherein the two opposite side surface of the bridge pattern that are uncovered by the insulating pattern contact the island electrode pattern and the first sub-detection electrode, respectively.

* * * * *